(12) United States Patent
Ramareddy et al.

(10) Patent No.: US 11,445,002 B2
(45) Date of Patent: *Sep. 13, 2022

(54) COMPUTING SYSTEM WITH DATA TRANSFER BASED UPON DEVICE DATA FLOW CHARACTERISTICS AND RELATED METHODS

(71) Applicant: CITRIX SYSTEMS, INC., Fort Lauderdale, FL (US)

(72) Inventors: Shashidhar Ramareddy, Parkland, FL (US); Georgy Momchilov, Parkland, FL (US); Ankur Mittal, Bangalore (IN)

(73) Assignee: CITRIX SYSTEMS, INC., Fort Lauderdale, FL (US)

( * ) Notice: Subject to any disclaimer, the term of this patent is extended or adjusted under 35 U.S.C. 154(b) by 541 days.

This patent is subject to a terminal disclaimer.

(21) Appl. No.: 16/252,801

(22) Filed: Jan. 21, 2019

(65) Prior Publication Data

US 2020/0236196 A1    Jul. 23, 2020

(51) Int. Cl.
*G06F 9/44* (2018.01)
*G06F 16/955* (2019.01)
(Continued)

(52) U.S. Cl.
CPC .............. *H04L 67/01* (2022.05); *G06F 9/452* (2018.02); *G06F 16/27* (2019.01); *H04L 41/12* (2013.01); *H04L 69/04* (2013.01)

(58) Field of Classification Search
None
See application file for complete search history.

(56) References Cited

U.S. PATENT DOCUMENTS 9,154,488 B2    10/2015    Innes et al.
9,176,744 B2    11/2015    Lee
(Continued)

OTHER PUBLICATIONS

Haipeng Jin et al, "Using sigcomp to compress SIP/SDP messages" Communications, 2005. ICC 2005. 2005 IEEE in International Conference on Seoul, Korea May 16-20, 2005, IEEE, vol. 5: May 16, 2005; pp. 3107-3111.
(Continued)

*Primary Examiner* — Nicholas R Taylor
*Assistant Examiner* — Ho T Shiu
(74) *Attorney, Agent, or Firm* — Allen, Dyer, Doppelt + Gilchrist, PA

(57) ABSTRACT

A computing system may include a server, and a client computing device in communication with the server. The server may be configured to provide a corresponding virtual desktop instance for the client computing device. The computing system may include a local device to be coupled to a given client computing device and to be operable in a given virtual desktop instance associated with the given client computing device, thereby generating client initialization packets. The server may be configured to generate a server mapping table. The given client computing device may be configured to generate a client mapping table, replace a client packet with a client mapping ID number to define compressed client initialization packets, and send the compressed client initialization packets to the server. The server may be configured to replace the client mapping ID number with the client packet in the compressed client initialization packets based upon the server mapping table.

24 Claims, 17 Drawing Sheets

(51) Int. Cl.
*H04L 67/01* (2022.01)
*G06F 9/451* (2018.01)
*G06F 16/27* (2019.01)
*H04L 41/12* (2022.01)
*H04L 69/04* (2022.01)

(56) References Cited

U.S. PATENT DOCUMENTS

| | | | |
|---|---|---|---|
| 9,538,345 B2 | 1/2017 | Sah et al. | |
| 2007/0233877 A1* | 10/2007 | Qu | H04L 61/2517 709/227 |
| 2015/0113172 A1* | 4/2015 | Johnson | H04L 67/1004 709/245 |
| 2015/0128199 A1* | 5/2015 | Kuo | H04L 65/80 709/204 |
| 2018/0121224 A1* | 5/2018 | Vajravel | G06F 9/4484 |

OTHER PUBLICATIONS

Sahinalp et al. "Chapter 6—Dictionary-Based Data Compression: An Algorithmic Perspective" In "Lossless Compression Handbook" Academic Press, Elsevier Science Jan. 1, 2003; pp. 153-167.
U.S. Appl. No. 16/252,809, filed Jan. 21, 2019; Ramareddy et al.

* cited by examiner

905

| Identifier | Device | Client sequence | Server sequence |
|---|---|---|---|
| D 1 | VID: 1234 PID: 5678 (Webcam) | Captured request response sequence. | Captured request response sequence. |
| D 2 | VID:2345 PID: 6789 (Pen) | Captured request response sequence. | Captured request response sequence. |
| D 3 | VID: 1111 PID: 2222 (Sensor) | Captured request response sequence. | Captured request response sequence. |
| D 4 | VID: 4444 PID: 5555 (WACOM device) | Captured request response sequence. | Captured request response sequence. |

FIG. 5

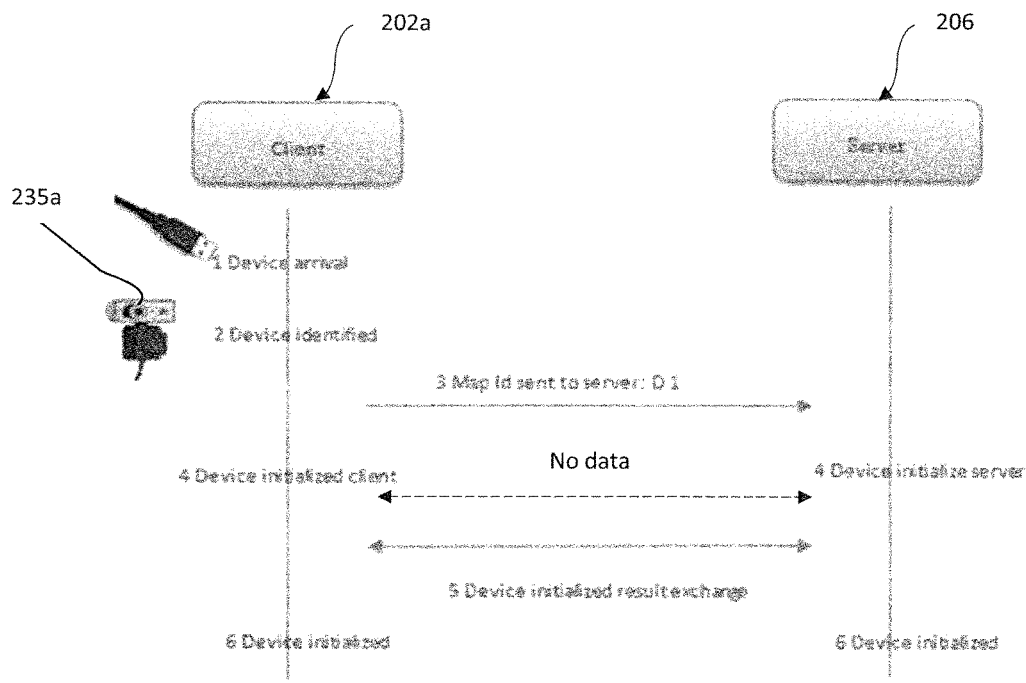

COMPUTING SYSTEM WITH DATA TRANSFER BASED UPON DEVICE DATA FLOW CHARACTERISTICS AND RELATED METHODS

BACKGROUND

In virtual desktop infrastructure systems, a typical user uses a terminal or client machine to connect to a remotely provided computing environment that provides a desktop paradigm. The remote or "virtual" desktop is typically kept or stored on a remote central server instead of on the hard-drive of the local client machine. Accordingly, the remote desktop may execute a single user operating system (e.g. Windows 10) or a multi-user operating system (e.g. Windows 10 Server), that allows multiple independent connections to separate virtual desktops. In this arrangement, the different users of the independent connections are capable of having different levels of authorization privileges. For example, some users may be permitted access to all, some or none of the applications, files, etc., of the computing environment.

Although client machines are often referred to as "dumb terminals", client machines offer a full desktop experience when connecting in a virtual desktop infrastructure environment, offering capabilities and performance, specifically designed to best leverage and enhance the performance and functionality of the virtual desktop infrastructure. For example, client machines are often highly configurable and perform a high degree of local processing (e.g., management of local screen and keyboard, management of locally connected devices, and handling of specific keys and/or key combinations).

Because the virtual desktop infrastructure provides the perception that the client machine is merely an extension of the remote computer, if a new device is attached to the client machine, it is necessary to configure the client machine to recognize and configure the device. In short, when the user connects a local device to the client machine, the virtual desktop instance needs to recognize and use the local device as if it was the client machine. Because of this, the virtual desktop infrastructure needs to establish a communication link with the local device. Depending on the bandwidth of the local device, this new link can be burdensome on the virtual desktop instance, and may create latency issues.

SUMMARY

Generally, a computing system may include a server, and at least one client computing device in communication with the server. The server may be configured to provide a corresponding at least one virtual desktop instance for the at least one client computing device. The computing system may include at least one local device to be coupled to a given client computing device and to be operable in a given virtual desktop instance associated with the given client computing device, thereby generating a plurality of client initialization packets. The server may be configured to generate a server mapping table comprising a plurality of known server packets associated with the at least one local device, and a plurality of server mapping identification (ID) numbers respectively associated with the plurality of known server packets.

The given client computing device may be configured to generate a client mapping table comprising a plurality of known client packets associated with the at least one local device, and a plurality of client mapping ID numbers respectively associated with the plurality of known client packets. The given client computing device may be configured to, when the at least one local device is coupled to the given client computing device, determine whether at least one client packet from the plurality of client initialization packets is within the client mapping table, replace the at least one client packet with at least one client mapping ID number to define a plurality of compressed client initialization packets, and send the plurality of compressed client initialization packets to the server. The server may be configured to replace the at least one client mapping ID number with the at least one client packet in the plurality of compressed client initialization packets based upon the server mapping table.

Additionally, the server and the given client computing device may be configured to synchronize the server mapping table and the client mapping table. The server may be configured to, when the at least one local device is coupled to the given client computing device, determine whether at least one server packet from a plurality of server initialization packets is within the server mapping table, replace the at least one server packet with at least one server mapping ID number to define a plurality of compressed server initialization packets, and send the plurality of compressed server initialization packets to the given client computing device.

In some embodiments, the server and the given client computing device may be configured to, when the at least one local device is decoupled from the given client computing device, perform the determining, the replacing, and the sending. The at least one client computing device may comprise a plurality of client computing devices, and the server may be configured to monitor packets exchanged between the plurality of client computing devices and respective local devices to generate the server mapping table.

Further, the plurality of known server packets and the plurality of known client packets each may comprise a communication standard initialization packet. The plurality of known server packets and the plurality of known client packets each may comprise at least one of a smart card initialization sequence packet, smart card authentication packet, smart card digital signing packet, and smart card certificate transmission packet.

The server mapping table and the client mapping table each may comprise a plurality of local device types associated with the plurality of client mapping ID numbers and the plurality of server mapping ID numbers. When the plurality of compressed client initialization packets generates an error, the server and the given client computing device may be configured to initialize the at least one local device using the plurality of client initialization packets.

In some embodiments, the computing system further may include a bridge device coupled between the given client computing device and the server and configured to generate a bridge mapping table comprising a plurality of known bridge packets associated with the at least one local device, and a corresponding plurality of bridge mapping ID numbers. The at least one local device may comprise at least one of a universal serial bus (USB) device, a TWAIN device, and a smart card device. The determining may be based upon at least one of client name, smart card reader name, smart card reader state, smart card type, smart card Answer to Reset (ATR) string, smart card ID, and smart card certificate hash.

Another aspect is directed to a method for operating a given client computing device in communication with a server. The server is to provide a given virtual desktop instance for the given client computing device, and at least one local device is to be coupled to the given client computing device and to be operable in the given virtual desktop instance associated with the given client computing device. The method may comprise generating a client mapping table comprising a plurality of known client packets associated with the at least one local device, and a plurality of client mapping ID numbers respectively associated with the plurality of known client packets. The method may include when the at least one local device is coupled to the given client computing device, generating a plurality of client initialization packets, determining whether at least one client packet from the plurality of client initialization packets is within the client mapping table, replacing the at least one client packet with at least one client mapping ID number to define a plurality of compressed client initialization packets, and sending the plurality of compressed client initialization packets to the server.

Yet another is directed to a method for operating a server in communication with at least one client computing device to provide a corresponding at least one virtual desktop instance for the at least one client computing device. At least one local device is to be coupled to a given client computing device and to be operable in a given virtual desktop instance associated with the given client computing device, thereby generating a plurality of server initialization packets. The method may include generating a server mapping table comprising a plurality of known server packets associated with the at least one local device, and a plurality of server mapping ID numbers respectively associated with the plurality of known server packets. The method may comprise when the at least one local device is coupled to the given client computing device, determining whether at least one server packet from the plurality of server initialization packets is within the server mapping table, replacing the at least one server packet with at least one server mapping ID number to define a plurality of compressed server initialization packets, and sending the plurality of compressed server initialization packets to the given client computing device.

BRIEF DESCRIPTION OF THE DRAWINGS

FIG. 5 is a diagram of a server mapping table or a client mapping table in the computing system according to the disclosure.

FIG. 6 is a diagram of communication flow between the client computing device and the server in the computing system of FIG. 3A.

Figure 10A:
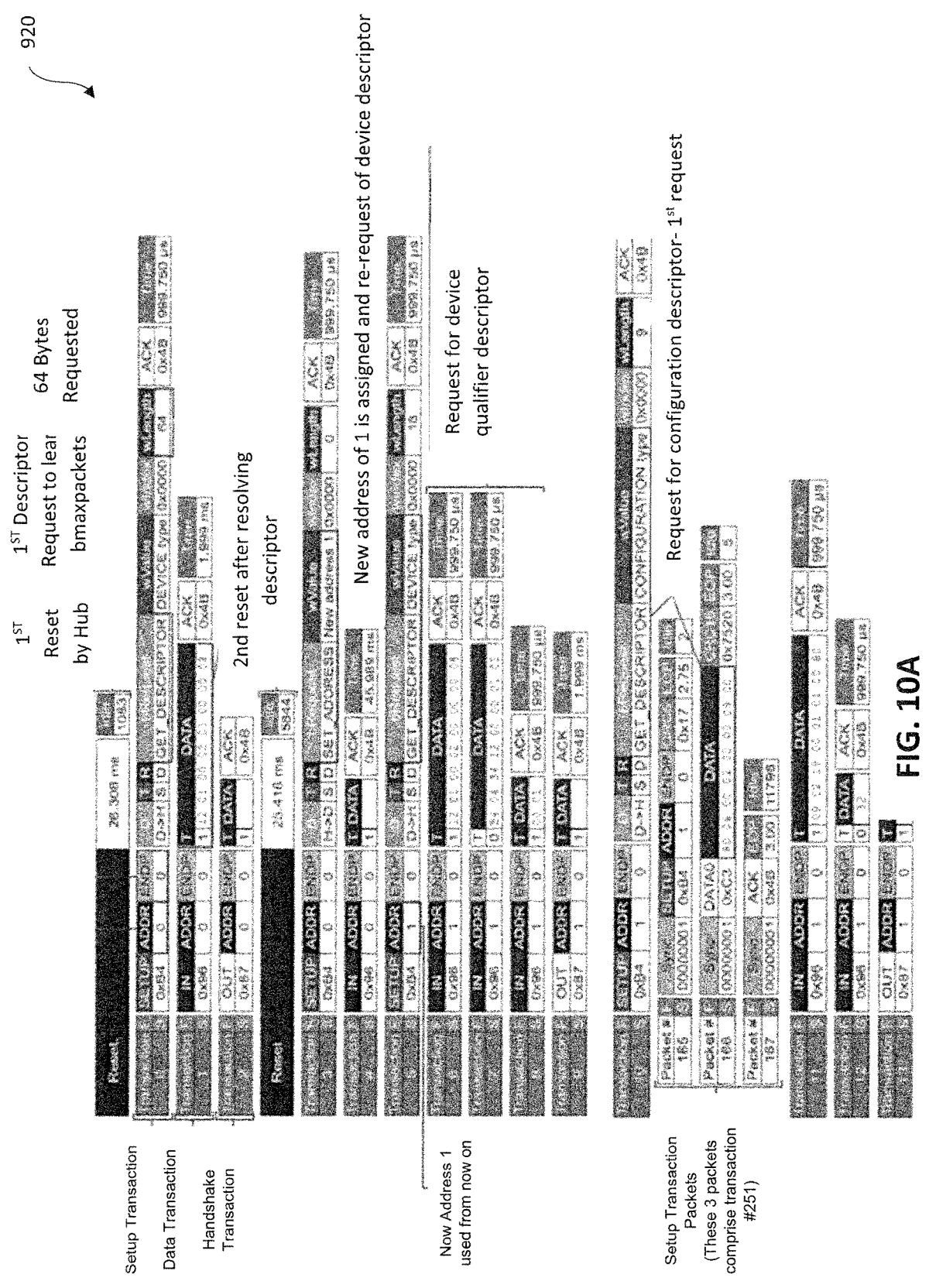
Figure 10D:
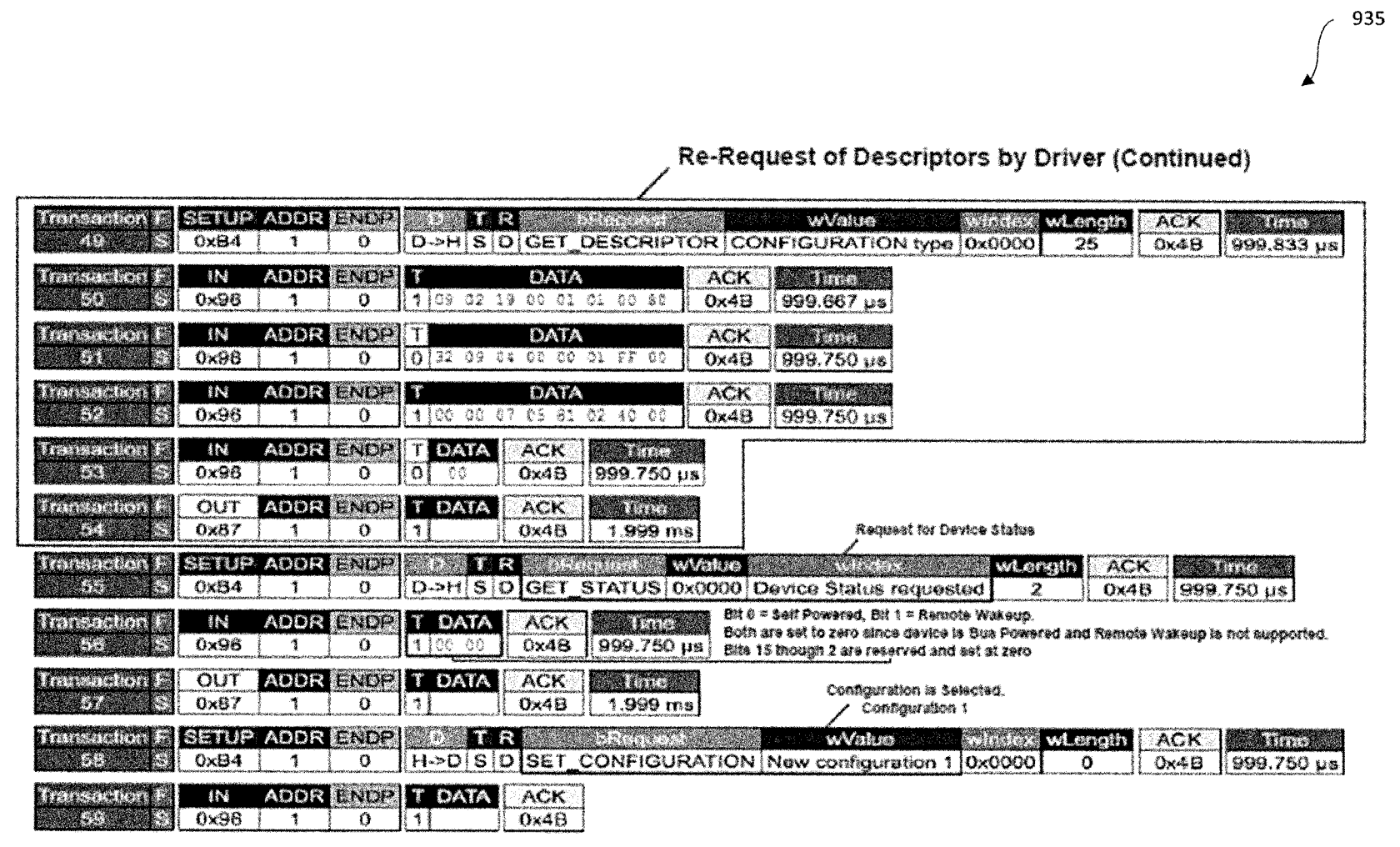

FIGS. 10A-10D are diagrams of device initialization data exchanges in the computing system according to the disclosure.

DETAILED DESCRIPTION

Figure 1:
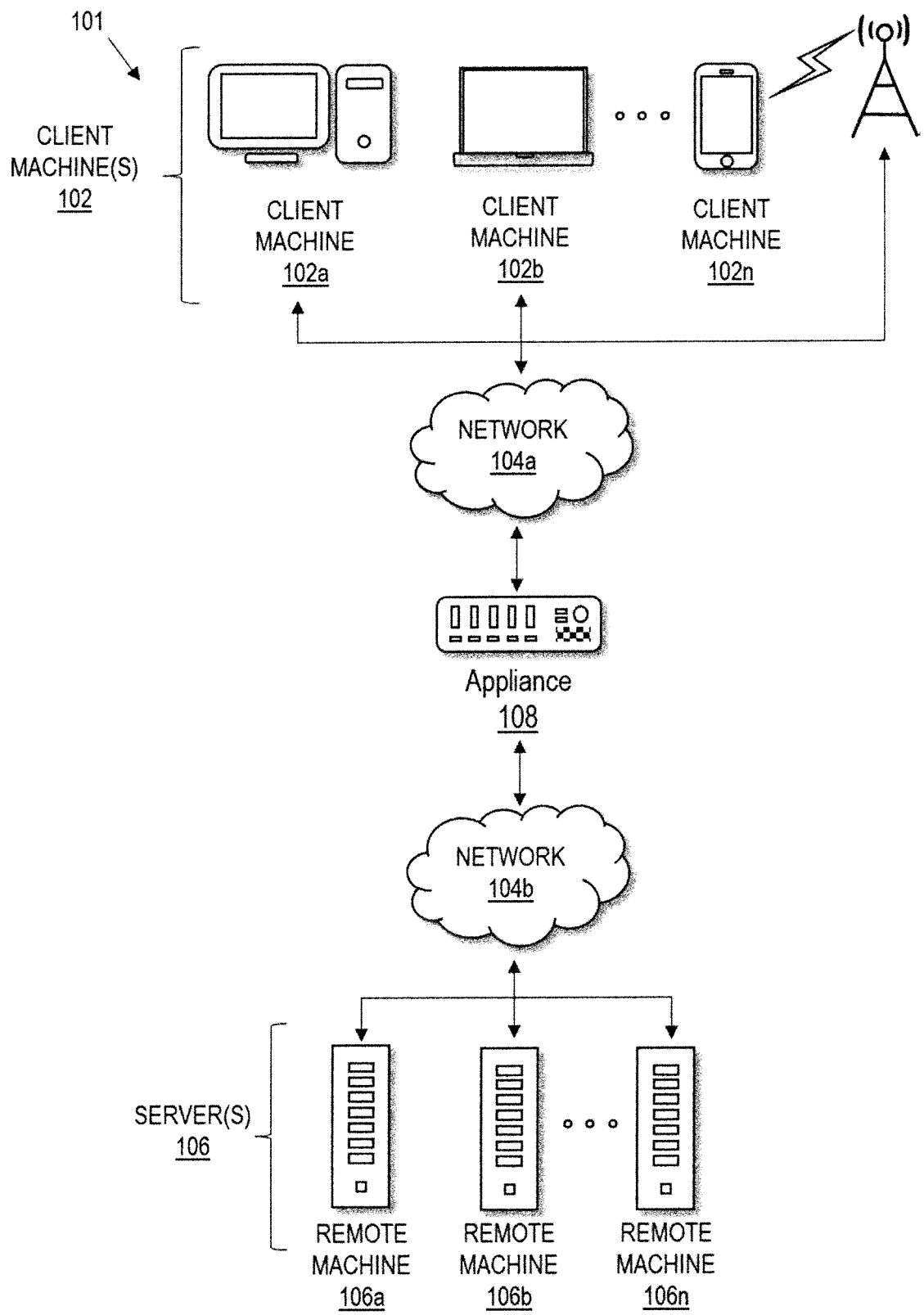
FIG. 1 is a schematic block diagram of a network environment of computing devices in which various aspects of the disclosure may be implemented.

The present description is made with reference to the accompanying drawings, in which example embodiments are shown. However, many different embodiments may be used, and thus the description should not be construed as limited to the particular embodiments set forth herein. Like numbers refer to like elements throughout, and base 100 reference numerals are used to indicate similar elements in alternative embodiments.

As will be appreciated by one of skill in the art upon reading the following disclosure, various aspects described herein may be embodied as a device, a method or a computer program product (e.g., a non-transitory computer-readable medium having computer executable instruction for performing the noted operations or steps). Accordingly, those aspects may take the form of an entirely hardware embodiment, an entirely software embodiment, or an embodiment combining software and hardware aspects.

Furthermore, such aspects may take the form of a computer program product stored by one or more computer-readable storage media having computer-readable program code, or instructions, embodied in or on the storage media. Any suitable computer readable storage media may be utilized, including hard disks, CD-ROMs, optical storage devices, magnetic storage devices, solid-state storage devices, and/or any combination thereof.

Referring initially to FIG. 1, a non-limiting network environment 101 (i.e. a communication system) in which various aspects of the disclosure may be implemented includes one or more client machines 102a-102n, one or more remote machines 106a-106n, one or more networks 104a, 104b, and one or more appliances 108 installed within the computing environment 101. The client machines 102a-102n communicate with the remote machines 106a-106n via the networks 104a, 104b.

In some embodiments, the client machines 102a-102n communicate with the remote machines 106a-106n via an intermediary appliance 108. The illustrated appliance 108 is positioned between the networks 104a, 104b and may also be referred to as a network interface or gateway. In some embodiments, the appliance 108 may operate as an application delivery controller (ADC) to provide clients with access to business applications and other data deployed in a datacenter, the cloud, or delivered as Software as a Service (SaaS) across a range of client devices, and/or provide other functionality such as load balancing, etc. In some embodiments, multiple appliances 108 may be used, and the appliance(s) 108 may be deployed as part of the network 104a and/or 104b.

The client machines 102a-102n may be generally referred to as client machines 102, local machines 102, clients 102, client nodes 102, client computers 102, client devices 102, computing devices 102, endpoints 102, or endpoint nodes 102. The remote machines 106a-106n may be generally referred to as servers 106 or a server farm 106. In some embodiments, a client device 102 may have the capacity to function as both a client node seeking access to resources provided by a server 106 and as a server 106 providing access to hosted resources for other client devices 102a-102n. The networks 104a, 104b may be generally referred to as a network. The networks 104a, 104b may be configured in any combination of wired and wireless networks.

A server 106 may be any server type such as, for example: a file server; an application server; a web server; a proxy server; an appliance; a network appliance; a gateway; an application gateway; a gateway server; a virtualization server; a deployment server; a Secure Sockets Layer (SSL) or Transport Layer Security (TLS) Virtual Private Network (VPN) server; a firewall; a web server; a server executing an active directory; a cloud server; or a server executing an application acceleration program that provides firewall functionality, application functionality, or load balancing functionality.

A server 106 may execute, operate or otherwise provide an application that may be any one of the following: software; a program; executable instructions; a virtual machine; a hypervisor; a web browser; a web-based client; a client-server application; a thin-client computing client; an ActiveX control; a Java applet; software related to voice over internet protocol (VoIP) communications like a soft IP telephone; an application for streaming video and/or audio; an application for facilitating real-time-data communications; a HTTP client; a FTP client; an Oscar client; a Telnet client; or any other set of executable instructions.

In some embodiments, a server 106 may execute a remote presentation services program or other program that uses a thin-client or a remote-display protocol to capture display output generated by an application executing on a server 106 and transmit the application display output to a client device 102. In yet other embodiments, a server 106 may execute a virtual machine providing, to a user of a client device 102, access to a computing environment. The client device 102 may be a virtual machine. The virtual machine may be managed by, for example, a hypervisor, a virtual machine manager (VMM), or any other hardware virtualization technique within the server 106.

In some embodiments, the network 104a, 104b may be: a local-area network (LAN); a metropolitan area network (MAN); a wide area network (WAN); a primary public network; and a primary private network. Additional embodiments may include a network 104a, 104b of mobile telephone networks that use various protocols to communicate among mobile devices. For short range communications within a wireless local-area network (WLAN), the protocols may include IEEE 802.11, Bluetooth, and Near Field Communication (NFC).

Figure 2:
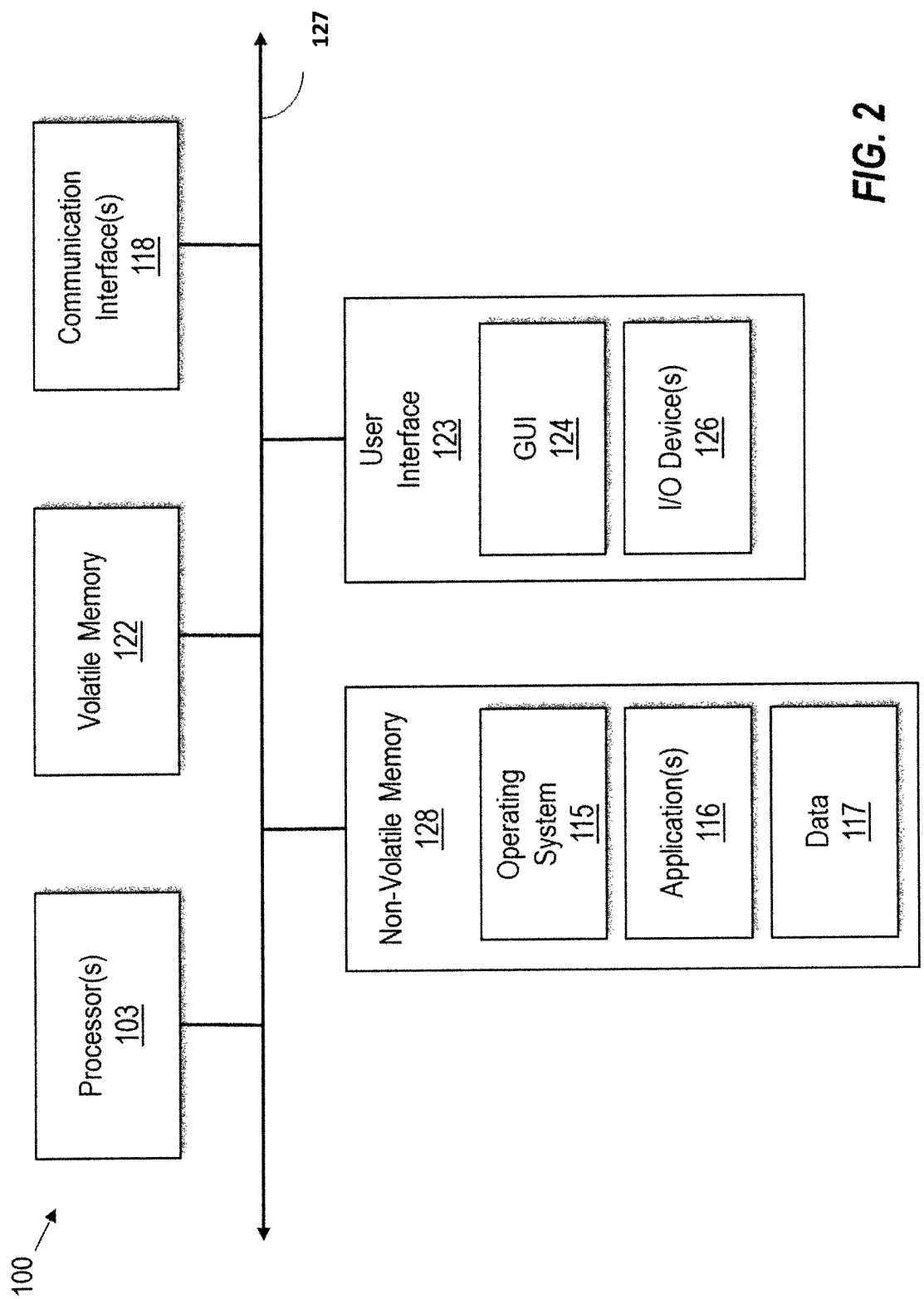
FIG. 2 is a schematic block diagram of a computing device useful for practicing an embodiment of the client machines or the remote machines illustrated in FIG. 1.

FIG. 2 depicts a block diagram of a computing device 100 useful for practicing an embodiment of client devices 102, appliances 108 and/or servers 106. The computing device 100 includes one or more processors 103, volatile memory 122 (e.g., random access memory (RAM)), non-volatile memory 128, user interface (UI) 123, one or more communications interfaces 118, and a communications bus 127. The non-volatile memory 128 may include: one or more hard disk drives (HDDs) or other magnetic or optical storage media; one or more solid state drives (SSDs), such as a flash drive or other solid-state storage media; one or more hybrid magnetic and solid-state drives; and/or one or more virtual storage volumes, such as a cloud storage, or a combination of such physical storage volumes and virtual storage volumes or arrays thereof.

The user interface 123 may include a graphical user interface (GUI) 124 (e.g., a touchscreen, a display, etc.) and one or more input/output (I/O) devices 126 (e.g., a mouse, a keyboard, a microphone, one or more speakers, one or more cameras, one or more biometric scanners, one or more environmental sensors, and one or more accelerometers, etc.).

The non-volatile memory 128 stores an operating system 115, one or more applications 116, and data 117 such that, for example, computer instructions of the operating system 115 and/or the applications 116 are executed by processor(s) 103 out of the volatile memory 122. In some embodiments, the volatile memory 122 may include one or more types of RAM and/or a cache memory that may offer a faster response time than a main memory. Data may be entered using an input device of the GUI 124 or received from the I/O device(s) 126. Various elements of the computer 100 may communicate via the communications bus 127.

The illustrated computing device 100 is shown merely as an example client device or server, and may be implemented by any computing or processing environment with any type of machine or set of machines that may have suitable hardware and/or software capable of operating as described herein.

The processor(s) 103 may be implemented by one or more programmable processors to execute one or more executable instructions, such as a computer program, to perform the functions of the system. As used herein, the term "processor" describes circuitry that performs a function, an operation, or a sequence of operations. The function, operation, or sequence of operations may be hard coded into the circuitry or soft coded by way of instructions held in a memory device and executed by the circuitry. A processor may perform the function, operation, or sequence of operations using digital, values and/or using analog signals.

In some embodiments, the processor can be embodied in one or more application specific integrated circuits (ASICs), microprocessors, digital signal processors (DSPs), graphics processing units (GPUs), microcontrollers, field programmable gate arrays (FPGAs), programmable logic arrays (PLAs), multi-core processors, or general-purpose computers with associated memory.

The processor 103 may be analog, digital or mixed-signal. In some embodiments, the processor 103 may be one or more physical processors, or one or more virtual (e.g., remotely located or cloud) processors. A processor including multiple processor cores and/or multiple processors may provide functionality for parallel, simultaneous execution of instructions or for parallel, simultaneous execution of one instruction on more than one piece of data.

The communications interfaces 118 may include one or more interfaces to enable the computing device 100 to access a computer network such as a Local Area Network (LAN), a Wide Area Network (WAN), a Personal Area Network (PAN), or the Internet through a variety of wired and/or wireless connections, including cellular connections.

In described embodiments, the computing device 100 may execute an application on behalf of a user of a client device. For example, the computing device 100 may execute one or more virtual machines managed by a hypervisor. Each virtual machine may provide an execution session within which applications execute on behalf of a user or a client device, such as a hosted desktop session. The computing device 100 may also execute a terminal services session to provide a hosted desktop environment. The computing device 100 may provide access to a remote computing environment including one or more applications, one or more desktop applications, and one or more desktop sessions in which one or more applications may execute.

Additional descriptions of a computing device 100 configured as a client device 102 or as a server 106, or as an appliance intermediary to a client device 102 and a server 106, and operations thereof, may be found in U.S. Pat. Nos. 9,176,744 and 9,538,345, which are incorporated herein by reference in their entirety. The '744 and '345 patents are both assigned to the current assignee of the present disclosure.

Figure 3A:
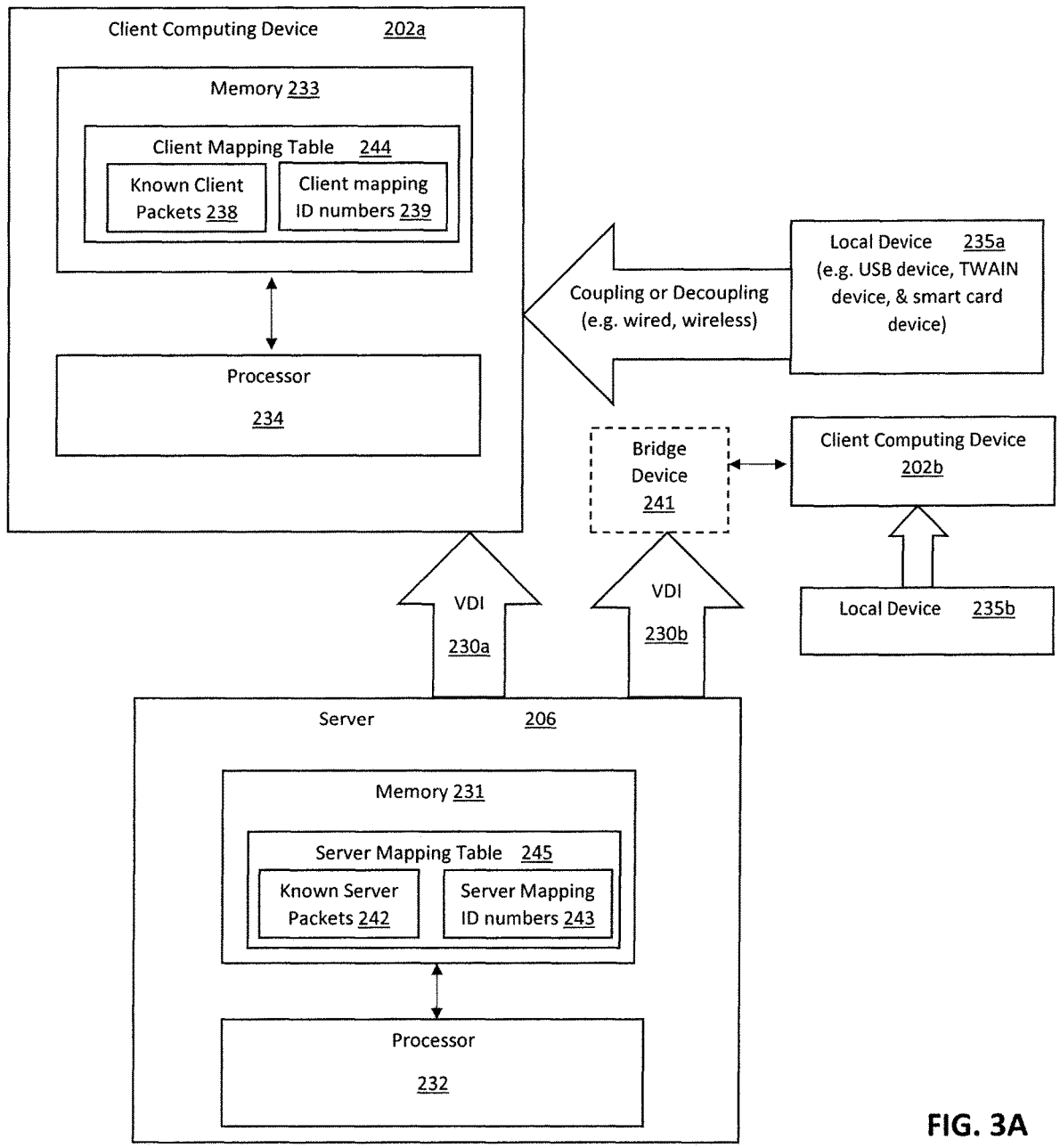
FIG. 3A is a schematic block diagram of a first embodiment of a computing system with data transfer between a server and a client computing device based upon device data flow characteristics, according to the disclosure.

Referring now to FIG. 3A, a computing system 201 (FIG. 3A) according to the disclosure is now described. Also, with reference to a flowchart 940 (FIG. 4A), a method for operating the computing system 201 is also described. The computing system 201 illustratively includes a server 206, and a plurality of client computing devices 202a-202b in communication with the server. The server 206 is configured to provide a corresponding plurality of virtual desktop instances 230a-230b for the plurality of client computing devices 202a-202b.

The computing system 201 includes a plurality of local devices 235a-235b to be coupled respectively to the plurality of client computing devices 202a-202b. The local device 235a is coupled to a given client computing device 202a and to be operable in a given virtual desktop instance 230a associated with the given client computing device, thereby generating a plurality of client initialization packets. The server 206 is configured to generate a server mapping table 245 comprising a plurality of known server packets 242 associated with the local device 235a, and a plurality of server mapping ID numbers 243 respectively associated with the plurality of known server packets.

The given client computing device 202a is configured to generate a client mapping table 244 comprising a plurality of known client packets 238 associated with the local device 235a, and a plurality of client mapping ID numbers 239 respectively associated with the plurality of known client packets. The given client computing device 202a is configured to, when the local device 235a is coupled to the given client computing device, determine whether at least one client packet from the plurality of client initialization packets is within the client mapping table 244, replace the at least one client packet with at least one client mapping ID number 239 to define a plurality of compressed client initialization packets, and send the plurality of compressed client initialization packets to the server 206. The server 206 is configured to replace the at least one client mapping ID number 239 with the at least one client packet in the plurality of compressed client initialization packets based upon the server mapping table 245.

Figure 4A:
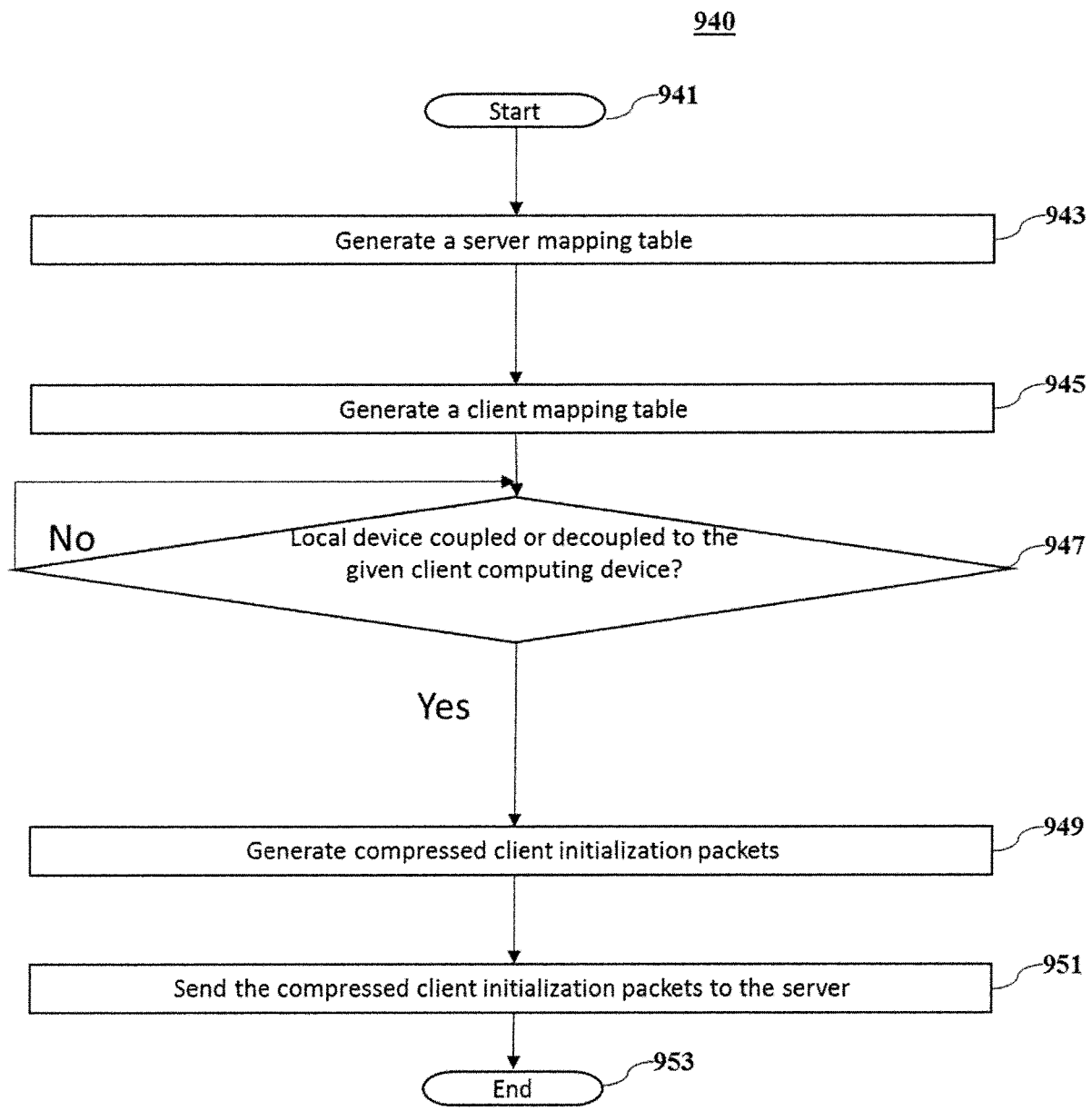
FIG. 4A is a flowchart of a method for operating the computing system of FIG. 3A.

Referring now to FIG. 4A, the method for operating the computing system 201 is now described with reference to the flowchart 940. (Block 941). The method includes generating the server mapping table 245 at the server 206 (Block 943), and generating the client mapping table 244 at the given client computing device 202a. (Block 945). The method illustratively includes determining when the local device 235a is coupled to the given client computing device 202a (Block 947), and then generating the plurality of compressed client initialization packets (Block 949), and sending the plurality of compressed client initialization packets to the server 206. (Blocks 951, 953).

Referring now again to FIG. 3A, the computing system 201 according to the disclosure is now described in more detail. Also, with reference to flowcharts 960, 980 (FIGS. 4B-4C), the method for operating the computing system 201 is also described in more detail. The computing system 201 illustratively includes a server 206, and a plurality of client computing devices 202a-202b in communication with the server.

The server 206 is configured to provide a corresponding plurality of virtual desktop instances 230a-230b for the plurality of client computing devices 202a-202b. The server 206 illustratively comprises a memory 231, and a processor 232 cooperating with the memory. Each of the plurality of client computing devices 202a-202b illustratively comprises a memory 233, and a processor 234 cooperating with the memory.

The computing system 201 illustratively comprises a plurality of local devices 235a-235b to be coupled respectively to the plurality of client computing devices 202a-202b and to be operable in a given virtual desktop instance 230a associated with the given client computing device, thereby generating a plurality of client initialization packets. Each local device 235a-235b may comprise one or more of a USB device, a TWAIN device, and a smart card device. Of course, this coupling may comprise a wired connection, or a wireless connection (e.g. Bluetooth, infrared, or some other local wireless standard).

As will be appreciated, when the user of the given client computing device 202a couples the local device 235a to the respective device providing the given virtual desktop instance 230a, the user expects the local device to be operable similarly to the local desktop environment. In particular, the user expects the resources of the local device 235a to be fully accessible in the given virtual desktop instance 230a.

In typical local desktop environments, when the local device 235a is coupled or decoupled, the local device and the local desktop environment (i.e. the local operating system) exchange local device initialization/deinitialization communications. Given that these local device communications standards were developed with local connections in mind (i.e. typically wired, high bandwidth, low latency, low packet loss), these local device communications standards are data heavy in nature.

Moreover, in the virtual desktop infrastructure space, these same local device communications standards must now be implemented over the network (e.g. the Internet) between the server 206 and the given client computing device 202a. The computing system 201 provides an approach to this issue by compressing these local device initialization/deinitialization communications at the server 206 and the given client computing device 202a.

The server 206 is configured to generate a server mapping table 245 comprising a plurality of known server packets 242 associated with the at least one local device, and a plurality of server mapping ID numbers 243 respectively associated with the plurality of known server packets. The given client computing device 202a is also configured to generate a client mapping table 244 comprising a plurality of known client packets 238 associated with the at least one local device, and a plurality of client mapping ID numbers 239 respectively associated with the plurality of known client packets.

The plurality of known server packets 242 and the plurality of known client packets 238 may each comprise a communication standard initialization packet (e.g. USB initialization/deinitialization packet). The plurality of known server packets 242 and the plurality of known client packets 238 each may comprise at least one of a smart card initialization sequence packet, smart card authentication packet, smart card digital signing packet, and smart card certificate transmission packet. In other words, the plurality of known server packets 242 and the plurality of known client packets 238 each comprise commonly exchanged packets.

The given client computing device 202a is configured to, when the local device 235a is either coupled or decoupled to the given client computing device, determine whether at least one client packet from the plurality of client initialization packets is within the client mapping table 244. In other words, this determining step is performed when the local device 235a initialization/deinitialization communications are about to be exchanged between the given client computing device 202a and the server 206. The determining may be based upon at least one of client name, smart card reader name, smart card reader state, smart card type, smart card ATR string, smart card ID, and smart card certificate hash.

If the at least one client packet is within the client mapping table 244, the given client computing device 202a is configured to replace the at least one client packet with at least one client mapping ID number 239 to define a plurality of compressed client initialization packets. If the at least one client packet is not within the client mapping table 244, then the given client computing device 202a is configured to move on to a next packet, and repeat the analysis.

In some embodiments, the given client computing device 202a is configured to examine each and every packet in the plurality of client initialization packets. In other embodiments, the given client computing device 202a is configured to selectively review only portions of the plurality of client initialization packets (e.g. portions more likely to have repeating packets). In other words, with a generated sequence of packets, the recognized packets are swapped out with respective client mapping ID numbers 239, which reduces the size of the payload.

Figure 11:
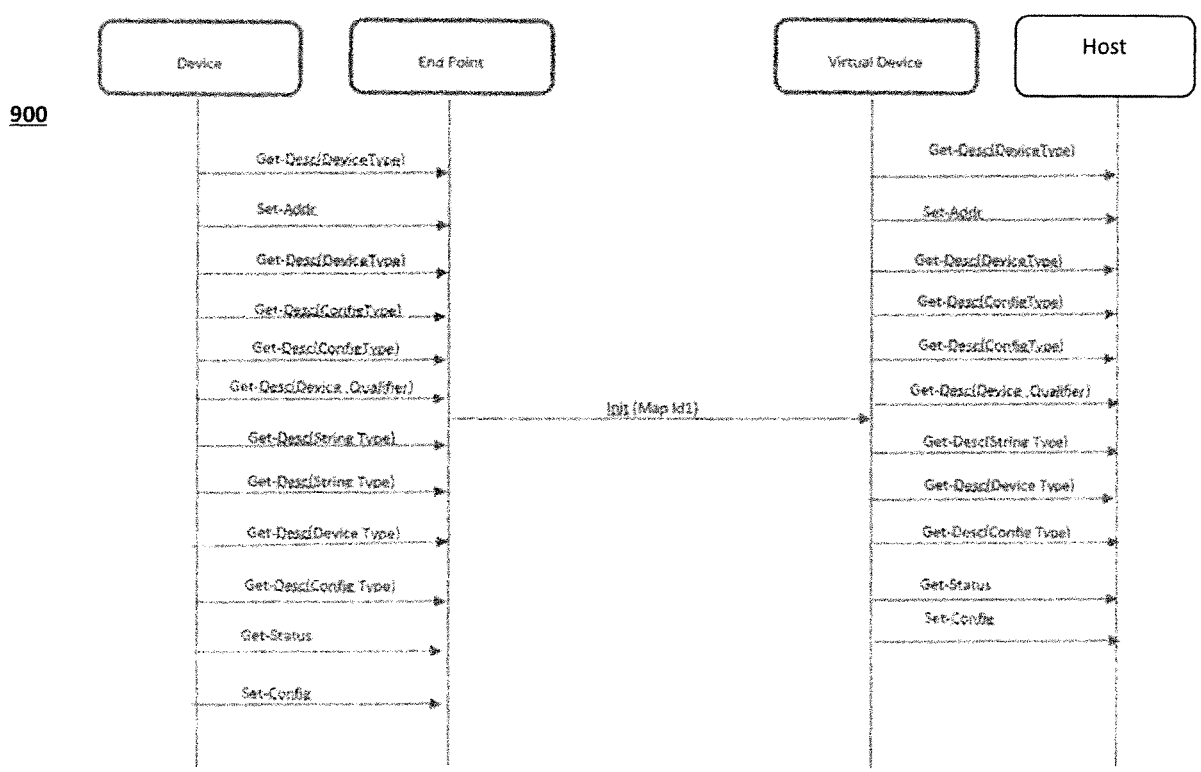
FIG. 11 is a diagram of a local device initialization sequence in the computing system according to the disclosure.

In some embodiments, the respective client mapping ID numbers 239 may each represent a common sequence for initialization and/or deinitialization. For example, instead of receiving a sequence of initialization packets from the given client computing device 202a, the server 206 would receive a single mapping ID number mapped to the same sequence, i.e. an effective instruction to playback the sequence of packets rather than sending the sequence of packets (See, e.g., FIG. 11). Also, in some embodiments where the local device 235a experiences a communication port change, the plurality of compressed client initialization packets would include that new port information.

Then, the given client computing device 202a is configured to send the plurality of compressed client initialization packets to the server 206. The server 206 is configured to receive the plurality of compressed client initialization packets. Subsequent to their receipt, the server 206 is configured to reconstitute the original initialization packets by replacing the at least one client mapping ID number 239 with the at least one client packet in the plurality of compressed client initialization packets based upon the server mapping table 245. To this end, the server 206 and the given client computing device 202a are configured to synchronize the server mapping table 245 and the client mapping table 244. As the server 206 and the given client computing device 202a build their respective mapping tables, they need to reconcile changes/additions so that the plurality of compressed client initialization packets can be properly processed.

Also, in some embodiments, the server 206 is configured to perform the same compression features with the server mapping table 245. In particular, the server 206 is configured to, when the local device 235a is coupled to the given client computing device 202a, determine whether at least one server packet from a plurality of server initialization packets is within the server mapping table 245, replace the at least one server packet with at least one server mapping ID number 243 to define a plurality of compressed server initialization packets, and send the plurality of compressed server initialization packets to the given client computing device. As will be appreciated, the plurality of server initialization packets are exchanged in response to the plurality of client initialization packets from the given client computing device 202a.

Moreover, the server 206 and the given client computing device 202a are configured to, when the local device 235a is decoupled from the given client computing device 202a, perform the determining, the replacing, and the sending. Indeed, as will be appreciated, the server 206 and the given client computing device 202a are configured to perform compression of local device deinitialization communications, and is not limited to local device initialization communications. As will be appreciated, the teachings of this disclosure could be expanded to any communications with reoccurring packets.

As depicted in the exemplary embodiment, it should be appreciated that the other client computing device 202b also has a local device 235b coupled thereto. Also, the server 206 may be configured to monitor packets exchanged between the plurality of client computing devices 202a-202b and respective local devices 235a-235b to generate the server mapping table 245. In other words, the server 206 is configured to learn reoccurring packet sequences from global communications in the computing system 201 and add them to the server mapping table 245 and the client mapping table 244. Indeed, in some embodiments, the server 206 may utilize machine learning techniques to predict packet sequences in communications between the server 206 and the plurality of client computing devices 202a-202b and respective local devices 235a-235b.

As will be appreciated, the computing system 201 illustratively includes only two client computing devices 202a-202b for drawing clarity. It should be appreciated that the computing system 201 could accommodate a large number of client computing devices. In fact, the server 206 may be configured to use big data analytics to further build the server mapping table 245 and the client mapping table 244.

Referring briefly to FIG. 5 and a diagram 905 therein, an exemplary embodiment of either the server mapping table 245 or the client mapping table 244 is shown. The server mapping table 245 and the client mapping table 244 each may comprise a plurality of local device types (device column) associated with the plurality of client mapping ID numbers 239 (identifier column) and the plurality of server mapping ID numbers 243 (identifier column).

Helpfully, when the plurality of compressed client initialization packets generates an error, the server 206 and the given client computing device 202a may be configured to initialize the at least one local device 235a-235b using the plurality of client initialization packets. In other words, if the plurality of compressed initialization packets causes an error, the server 206 and the given client computing device 202a revert to the uncompressed sequences to remedy the error (e.g. the USB connection would be reset, i.e. local USB device ejected, and then a reinitialization is performed).

Also, if the connection to the local device 235a-235b is lost, the server 206 and the given client computing device 202a are configured to reinitialize the connection automatically. If the local device 235a-235b is decoupled during the initialization, the given client computing device 202a is configured to send an abort message to the server 206 so that the server does not playout the initialization packets on its end.

As shown in the exemplary use application in FIG. 6, when the local device 235a (e.g., the illustrated web camera) is coupled to the client computing device 202a, the local device initialization is optimized. Indeed, in the illustrated step 4, no data is exchanged since these packets are standardized and stored in respective mapping tables. Here, the packets typically received at the server 206 from the client computing device 202a are played back or recreated from the server mapping table 245. The client computing device 202a does the same using the client mapping table 244.

In some embodiments, the computing system further may include a bridge device 241 coupled between the client computing device 202b and the server 206 and configured to generate a bridge mapping table comprising a plurality of known bridge packets associated with the at least one local device, and a corresponding plurality of bridge mapping ID numbers. In FIG. 3A, the bridge device 241 is depicted with dashed lines, and may be omitted. The bridge device 241 may comprise one or more of a Citrix Software-Defined Wide Area Network (SD-WAN) and a Citrix Gateway (NetScaler).

Figure 4B:
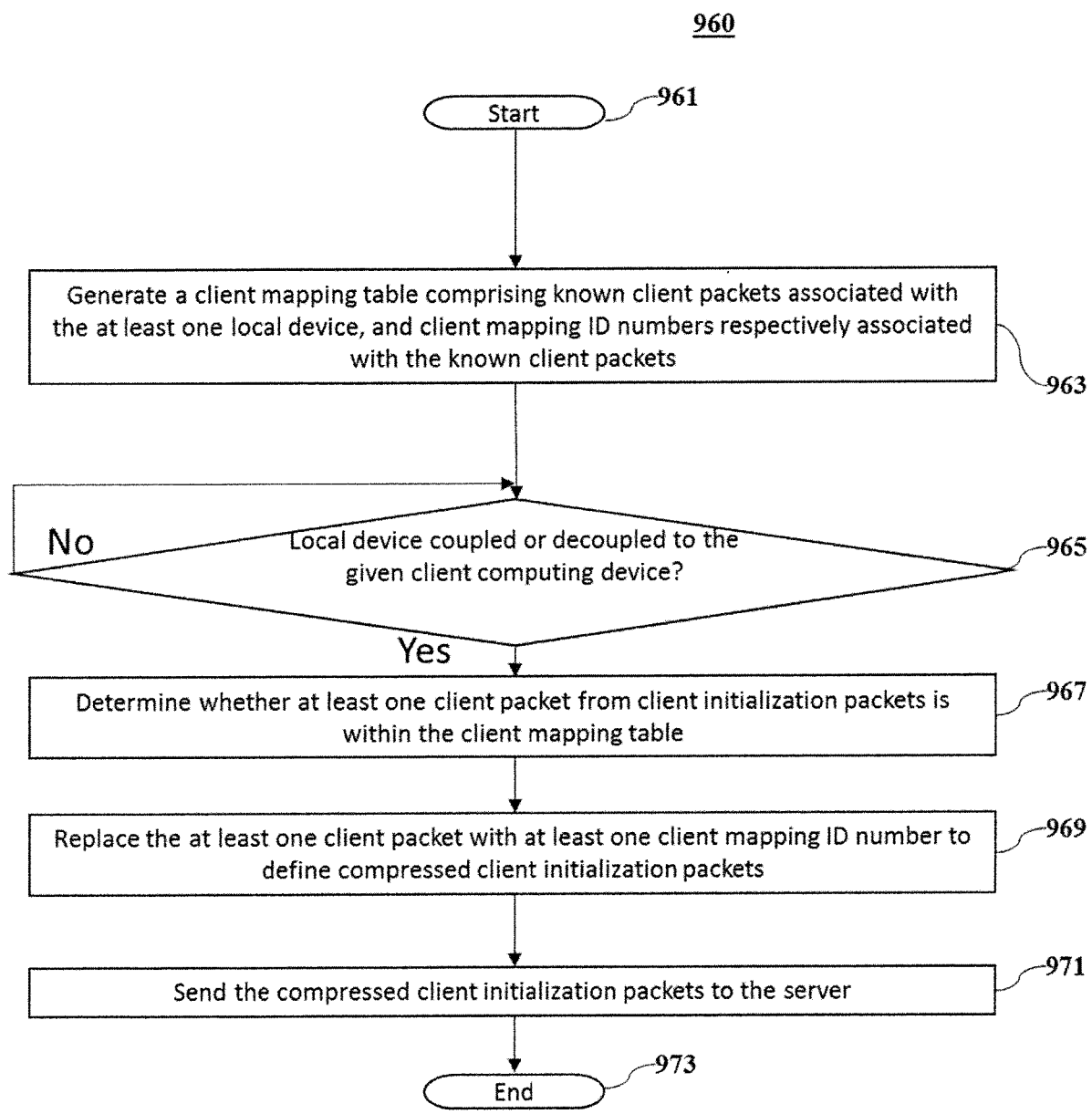
FIG. 4B is a flowchart of a method for operating the client computing device in the computing system of FIG. 3A.

Referring now to FIG. 4B and the flowchart 960 therein, a method for operating a given client computing device 202a in communication with a server 206 is now described. (Block 961). The server 206 is to provide a given virtual desktop instance 230a for the given client computing device 202a, and at least one local device 235a is to be coupled to the given client computing device and to be operable in the given virtual desktop instance 230a associated with the given client computing device. The method comprises generating a client mapping table 244 comprising a plurality of known client packets associated with the at least one local device 235a, and a plurality of client mapping ID numbers respectively associated with the plurality of known client packets. (Block 963). The method includes when the at least one local device 235a is coupled to the given client computing device 202a (Block 965), generating a plurality of client initialization packets, determining whether at least one client packet from the plurality of client initialization packets is within the client mapping table 244 (Block 967), replacing the at least one client packet with at least one client mapping ID number to define a plurality of compressed client initialization packets (Block 969), and sending the plurality of compressed client initialization packets to the server 206. (Blocks 971, 973).

Figure 4C:
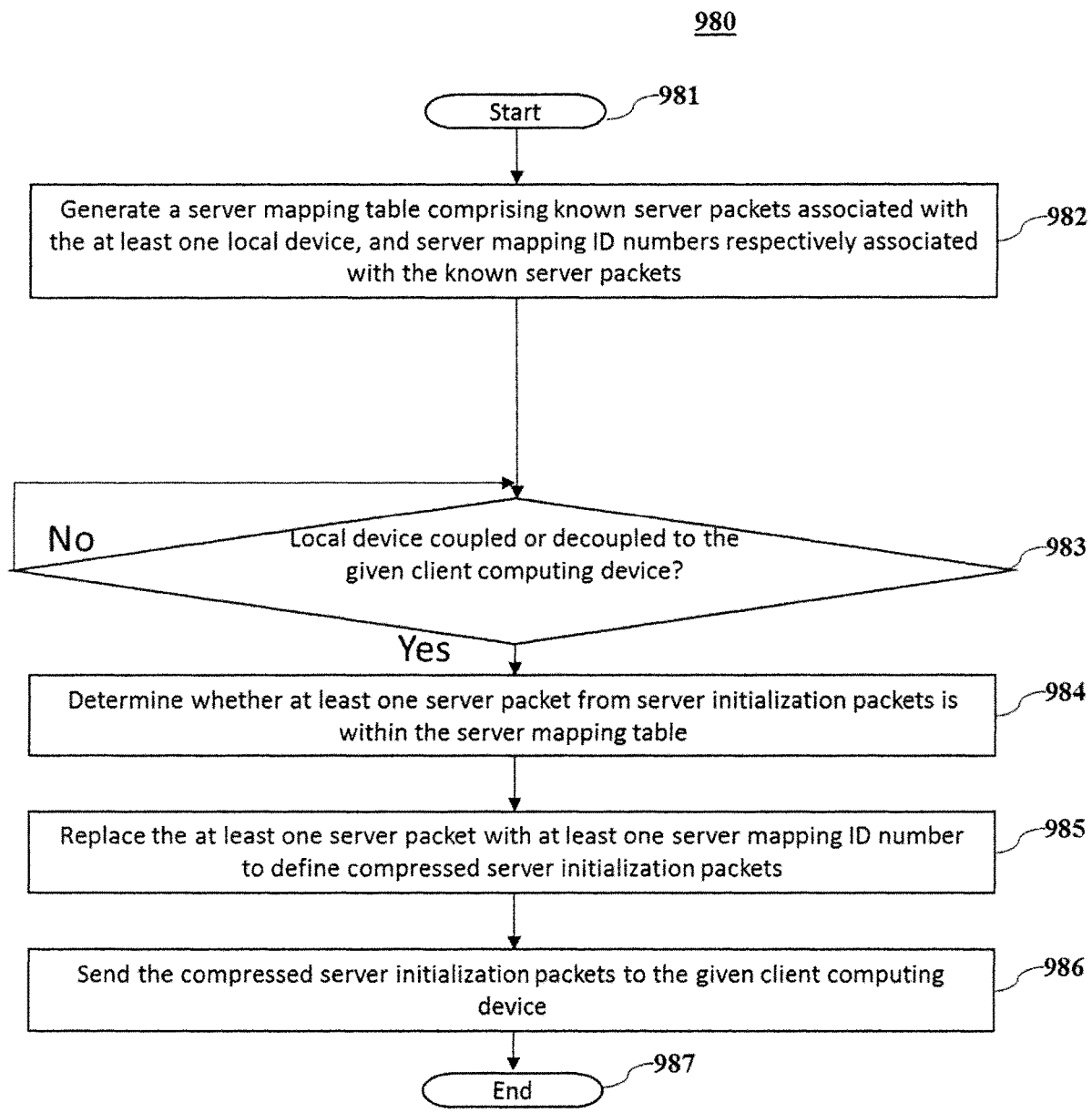
FIG. 4C is a flowchart of a method for operating the server in the computing system of FIG. 3A.

Referring now to FIG. 4C and the flowchart 980 therein, a method for operating the server 206 is now described. (Block 981). The server 206 is in communication with at least one client computing device 202a to provide a corresponding at least one virtual desktop instance 230a-230b for the at least one client computing device. At least one local device 235a is to be coupled to a given client computing device 202a and to be operable in a given virtual desktop instance 230a associated with the given client computing device, thereby generating a plurality of server initialization packets. The method includes generating a server mapping table 245 comprising a plurality of known server packets associated with the at least one local device 235a, and a plurality of server mapping ID numbers respectively associated with the plurality of known server packets. (Block 982). The method comprises when the at least one local device 235a is coupled to the given client computing device 202a (Block 983), determining whether at least one server packet from the plurality of server initialization packets is within the server mapping table 245 (Block 984), replacing the at least one server packet with at least one server mapping ID number to define a plurality of compressed server initialization packets (Block 985), and sending the plurality of compressed server initialization packets to the given client computing device. (Blocks 986, 987).

It should be appreciated that the above methods could be defined as a computer executable instruction. From this computer executable instruction, a non-transitory computer-readable medium having the computer executable instruction for performing the noted operations or steps of these methods could be provided.

Figure 3B:
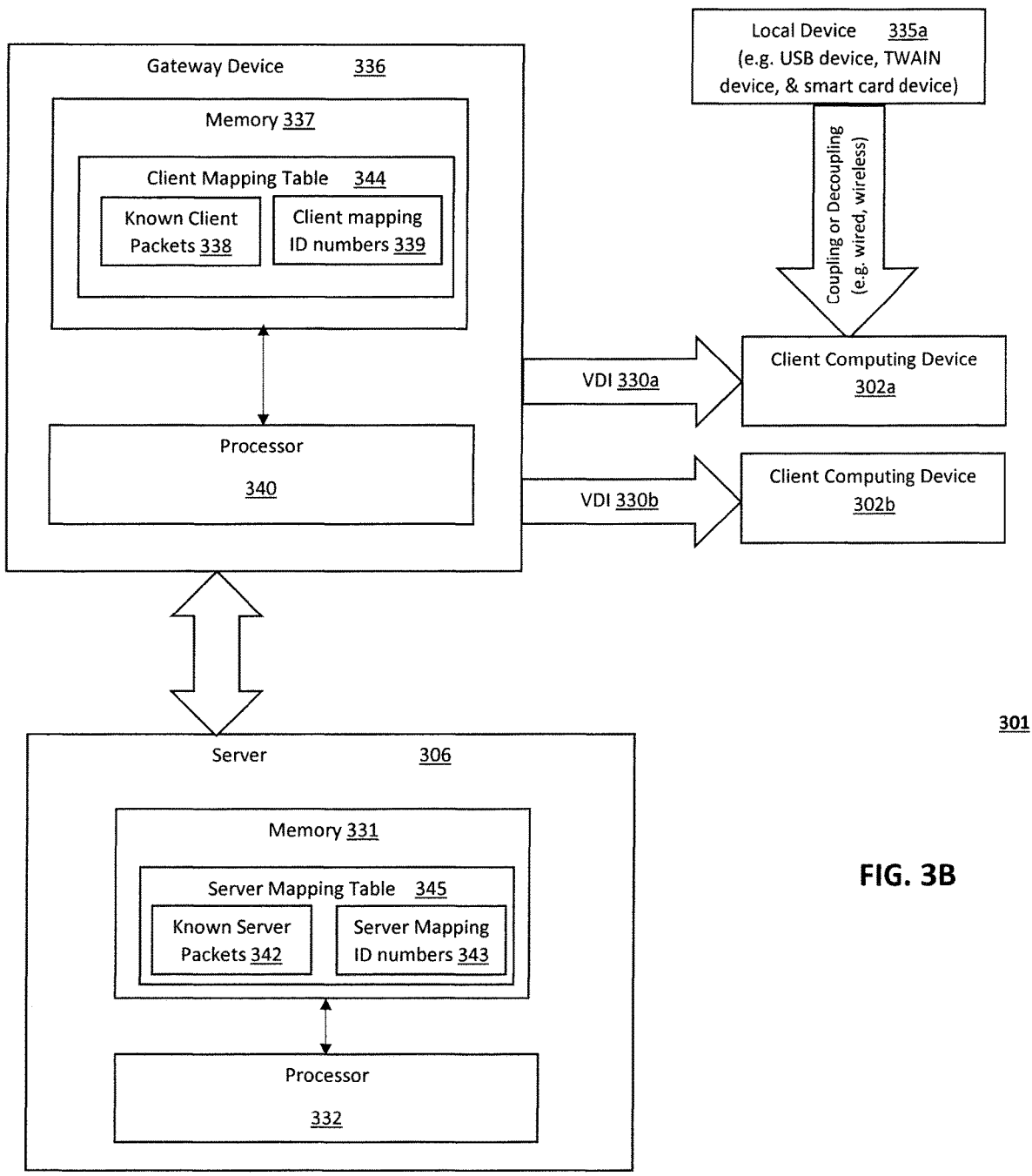
FIG. 3B is a schematic block diagram of a second embodiment of the computing system with data transfer between a server and a gateway device based upon device data flow characteristics, according to the disclosure.

Referring now additionally to FIG. 3B, another embodiment of the computing system 301 is now described. In this embodiment of the computing system 301, those elements already discussed above with respect to FIG. 3A are incremented by 300 and most require no further discussion herein. The computing system 301 illustratively includes a server 306, and a plurality of client computing devices 302a-302b. The server 306 is configured to provide a corresponding plurality of virtual desktop instances 330a-330b for the plurality of client computing devices 302a-302b. The server 306 illustratively comprises a memory 331, and a processor 332 cooperating with the memory. This embodiment differs from the previous embodiment in that this computing system 301 illustratively comprises a gateway device 336 in communication between the server 306 and the plurality of client computing devices 302a-302b, and a local device 335a to be coupled to a given client computing device 302a and to be operable in a given virtual desktop instance 330a associated with the given client computing device 302a, thereby generating a plurality of client initialization packets. In other words, the communications between the plurality of client computing devices 302a-302b and the server 306 are routed through the gateway device 336. The gateway device 336 illustratively comprises a memory 337, and a processor 340 cooperating with the memory.

The server 306 is configured to generate a server mapping table 345 comprising a plurality of known server packets 342 associated with the local device 335a, and a plurality of server mapping ID numbers 343 respectively associated with the plurality of known server packets. The gateway device 336 is configured to generate a client mapping table 344 comprising a plurality of known client packets 338 associated with the local device 335a, and a plurality of client mapping ID numbers 339 respectively associated with the plurality of known client packets.

As packets from the plurality of client computing devices 302a-302b are sent through the gateway device 336, the gateway device 336 is configured to, when the local device 335a is either coupled or decoupled to the given client computing device 302a, determine whether at least one client packet from the plurality of client initialization packets is within the client mapping table 344, replace the at least one client packet with at least one client mapping ID number 339 to define a plurality of compressed client initialization packets, and send the plurality of compressed client initialization packets to the server 306. The server 306 is configured to replace the at least one client mapping ID number

339 with the at least one client packet in the plurality of compressed client initialization packets based upon the server mapping table 345.

Referring now additionally to FIGS. 7, 8, 10A-10D, several diagrams 910, 915, 920, 925, 930, 935 relating to embodiments of the computing systems 201, 301 where the local device 235a-235b, 335a comprises a USB device are now described. Of course, this discussion regarding USB devices is exemplary, and is equally applicable to other types of the local device 235a-235b, 335a.

Figure 7:
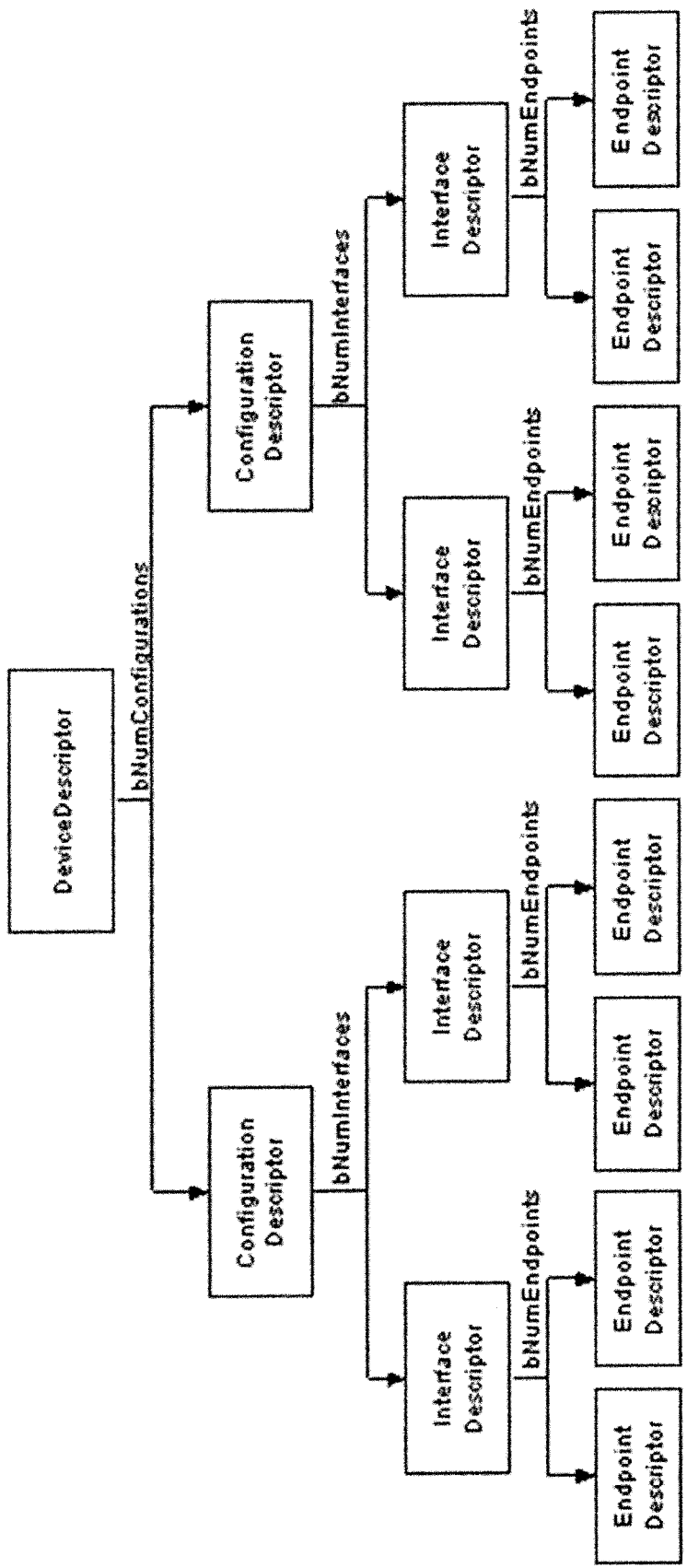
FIG. 7 is a diagram of local device descriptors in the computing system according to the disclosure.

With reference to FIG. 7, the diagram 910 includes a table showing the type of data associated with different USB device descriptors. USB initialization goes through standard set of USB request blocks (URB) exchanges of device descriptor, interface descriptor, pipe details etc. For a given local device (or type of device), these packets and sequence remains mostly the same with minor changes in certain fields. Because of this, these exchanges may benefit from the teachings of this disclosure.

In particular, descriptors used in local device 235a-235b, 335a initialization are shown. The descriptors are typically used for device enumeration in known order for each kind of device. For example, this sequence is translated to uniformity in the Independent Computing Architecture (ICA) protocol (USB Redirection Virtual Channel) between the client computing device 202a-202b, 302a-302b and the server 206, 306. Hence, with small exceptions of address, the data transfer will be predictable, and by using cached data with variable fields, the computing system 201, 301 could achieve packet replay at client computing device 202a-202b, 302a-302b and the server 206, 306.

Figure 8:
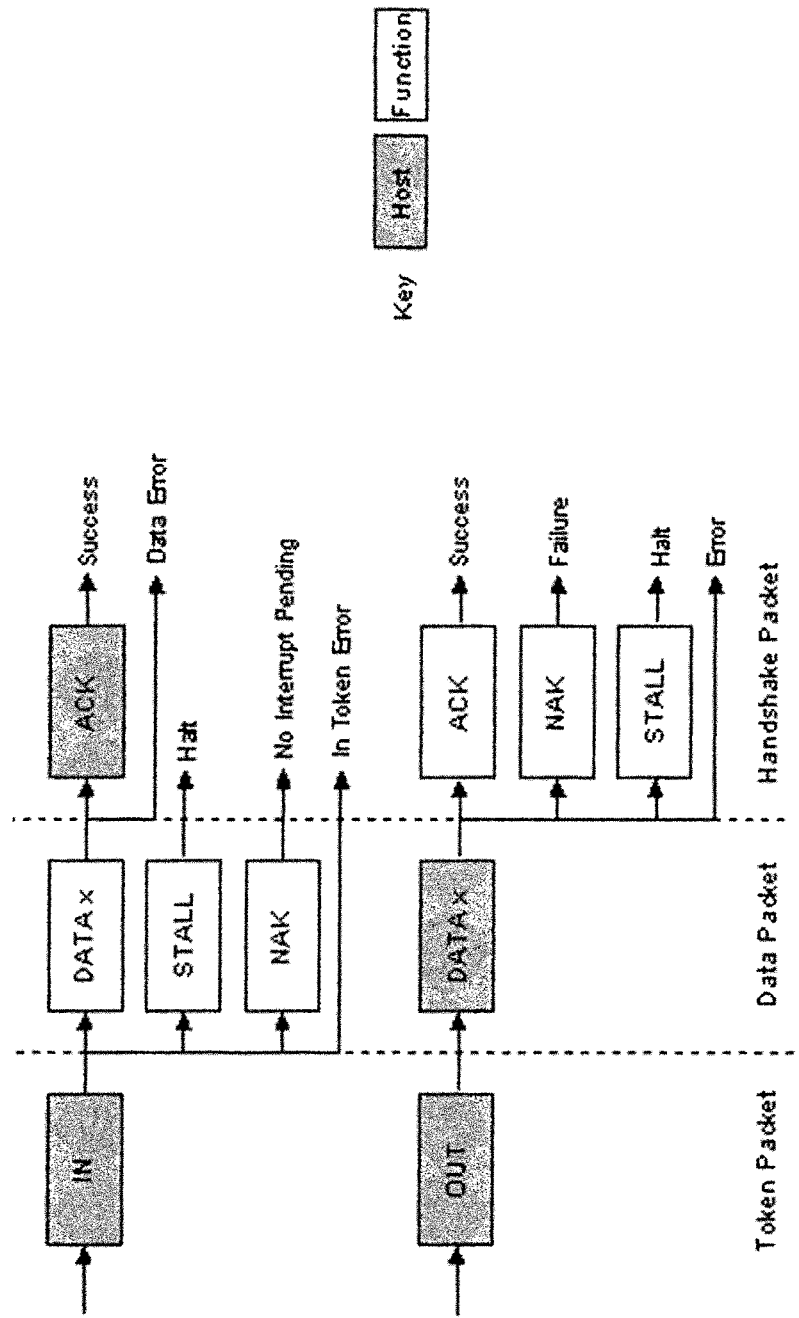
FIG. 8 is a diagram of a local device interrupt transfer sequence in the computing system according to the disclosure.

With reference to FIG. 8, the diagram 915 aids in discussing USB interrupt pipe control flow and interrupt transfers. In the USB standard, if the local device 235a-235b, 335a requires the attention of the host, it must wait until the host polls it. Interrupt transfers are typically non-periodic, small device "initiated" communication requiring bounded latency. An interrupt request is queued by the local device 235a-235b, 335a until the host polls the USB device asking for data. According to the teachings of this disclosure, the polling mechanism will be a cached operation on the client computing device 202a-202b, 302a-302b, which may avoid chattiness of connection from the server 206, 306 to client computing device.

Also, in embodiments of the computing systems 201, 301 where the local device 235a-235b, 335a comprises a smart card device, the teachings of the disclosure may be used to optimize smart card logon operations. For example, for redirected smart card authentication, the server 206, 306 is configured to create a smart card resource manager context. The host re-enumerates smart card readers, gets smart card status (e.g., empty, present, etc.), establishes smart card communication context, obtains the CARD ATR, which maps to card type, finds the Cryptographic Service Provider (CSP), retrieves the certificate from the card, and initiates a challenge-response mechanism, which normally involves the user entering a PIN to unlock the private key on the card, etc. In this case, the initialization sequence and, in particular, the retrieval of the certificate are very expensive operations involving multiple round-trips, which could be optimized. Some certificates may be several kilobytes in size. In addition, some smart cards may only support 1-byte addressing thus limiting transactions to 256 bytes. An optimization is possible, for example, by detecting repetitive logon patterns with endpoint device/client name, reader name, reader state, card type, card ID, or certificate hash, and mapping them to a mapping ID number. If no match is found on the server, the normal processes could be performed.

Figure 9A:
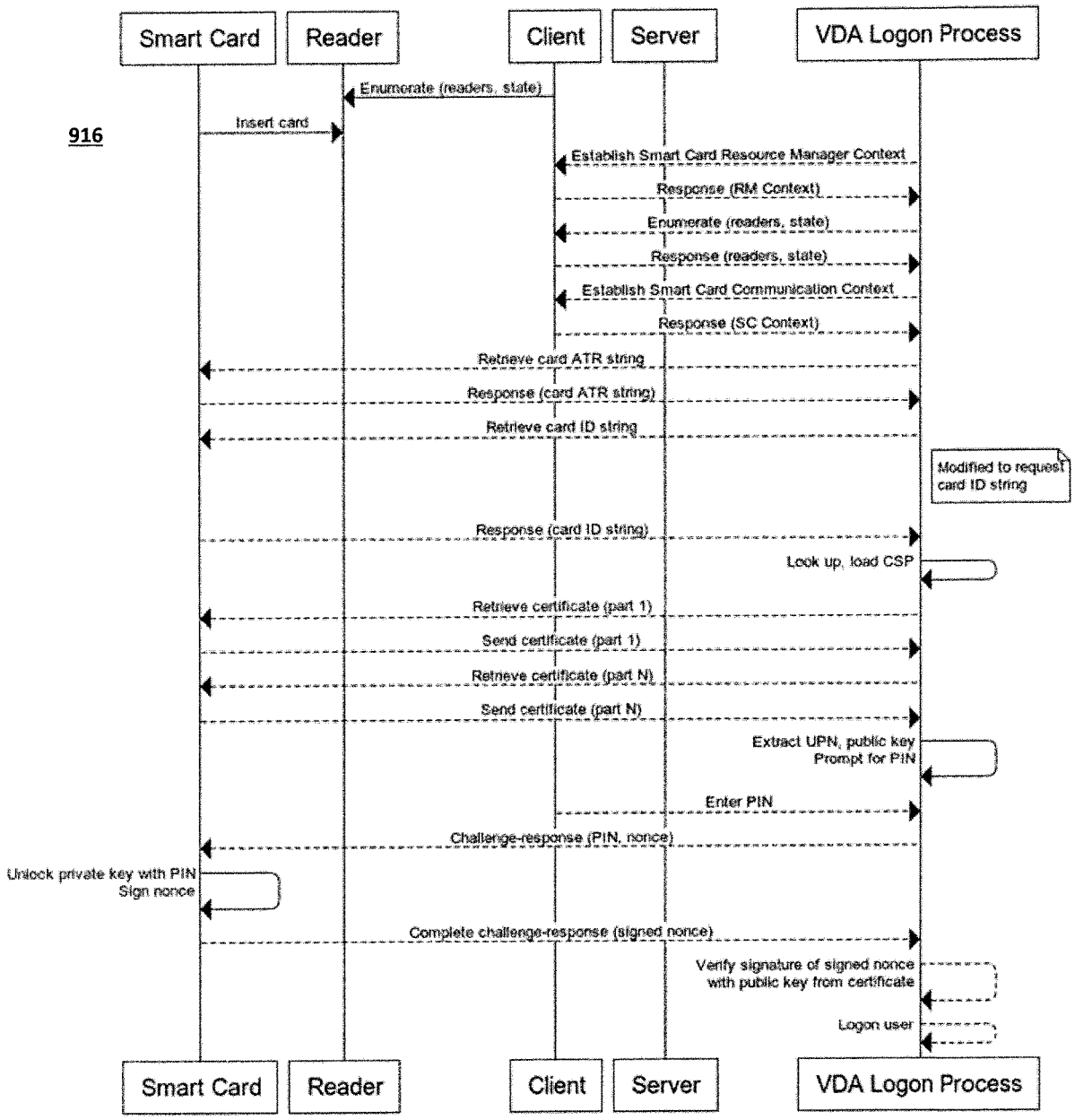
FIGS. 9A-9B are diagrams of non-optimized and optimized local device initialization data exchanges, respectively, in the computing system according to the disclosure.

Referring now to FIG. 9A and a diagram 916 therein, the following steps provide an example illustration of a non-optimized smart card authentication sequence. A similar sequence exists for other smart card scenarios, such as digitally signing documents, e-mails, etc., in a Virtual Delivery Agent (VDA) session. The execution of this sequence serves as a learning phase of the method to optimize smart card operations. The client device has a smart card reader attached to it. In some embodiments, the reader may be combined with a smart card into a single device, for example, into a USB dongle containing the smart card, while a virtual smart card reader is simulated by the client operating system (OS). Of course, this is an exemplary listing, and other variants could be used.

Smart Card Authentication Sequence

The client enumerates readers and their state (smart card empty, present, etc.).

A user inserts their card into the reader, the reader state changes.

The VDA Logon Process establishes Smart Card Resource Manager Context.

The request is forwarded to the client's OS Smart Card Resource Manager (RM). Note: The VDA Logon Process may involve multiple components or services, e.g. Logon UI, WinLogon, Local Security Authority Subsystem Service (LSASS), etc. It may also involve Smart Card/Personal Computer (SC/PC) application programming interface (API) hooking and redirection components. For purposes of this description, they are collectively referred to as VDA Logon Process.

The client creates a RM Context and returns it to the server VDA Logon Process.

Using the RM context, the VDA Logon Process enumerates readers and their state. The request is forwarded to the client.

The client returns to the VDA Logon Process the list of readers and their state.

Using the RM context, if there is a card present in at least one reader, the VDA Logon Process establishes smart card Communication Context. The request is forwarded to the client's OS smart card RM.

The client creates a smart card Communication Context and returns it to the server VDA Logon Process.

Using the smart card Communication Context, the VDA Logon Process retrieves the card ATR string. Likewise, the request is forwarded to the client's smart card. Note: The ATR string uniquely identifies the smart card type.

The client returns to the VDA Logon Process the card ATR string. Note: The following request is a modification of the normal sequence to facilitate the present disclosure, i.e. to uniquely identify the card.

The card ID string uniquely identifies the card. This is required, since an endpoint client device may be shared between multiple users (Kiosk mode).

The VDA Logon Process requests the card ID string.

The client returns to the VDA Logon Process the card ID string.

The VDA Logon Process looks up and loads the CSP, for example, based on the card ATR string. A CSP may perform crypto operations specific to a card type.

VDA Logon Process retrieves the smart card certificate over a series of transactions, which are redirected to the client's smart card, and involve multiple roundtrips.

The VDA Logon Process parses the certificate and extracts the User Principal Name (UPN), the public key, etc.

The VDA Logon Process then prompts the user for PIN, e.g. via a Logon UI. The PIN prompt becomes visible at the client device via server-to-client graphics redirection.

The user enters their PIN at the client, which is transferred to the server and into the VDA Logon Process, e.g. Logon UI.

The VDA Logon Process initiates a challenge required to determine if the user is the true owner of the smart card. The challenge may involve creating a (random) nonce sent to the card. The VDA Logon Process also sends the PIN to the card.

The client device communicates both the PIN and the nonce to the card. The PIN is used to unlock the use of the smart card's private key, which never leaves the card.

The card uses the private key to sign the nonce and answer the challenge by sending it to the server.

The VDA Logon Process verifies the signature of the signed nonce using the public key from certificate.

The VDA Logon Process proceeds to log the user on.

Figure 9B:
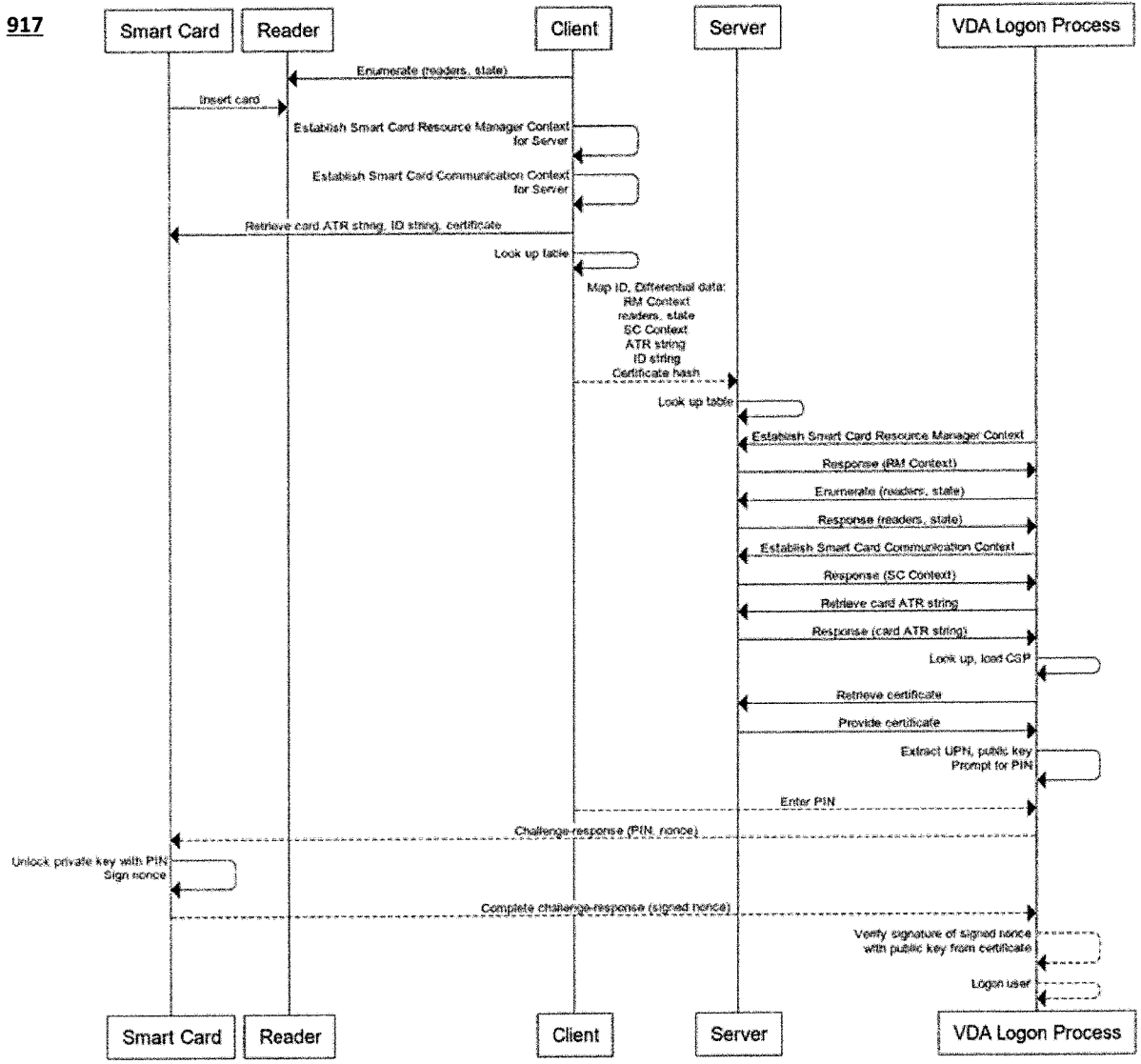
Figure 10B:
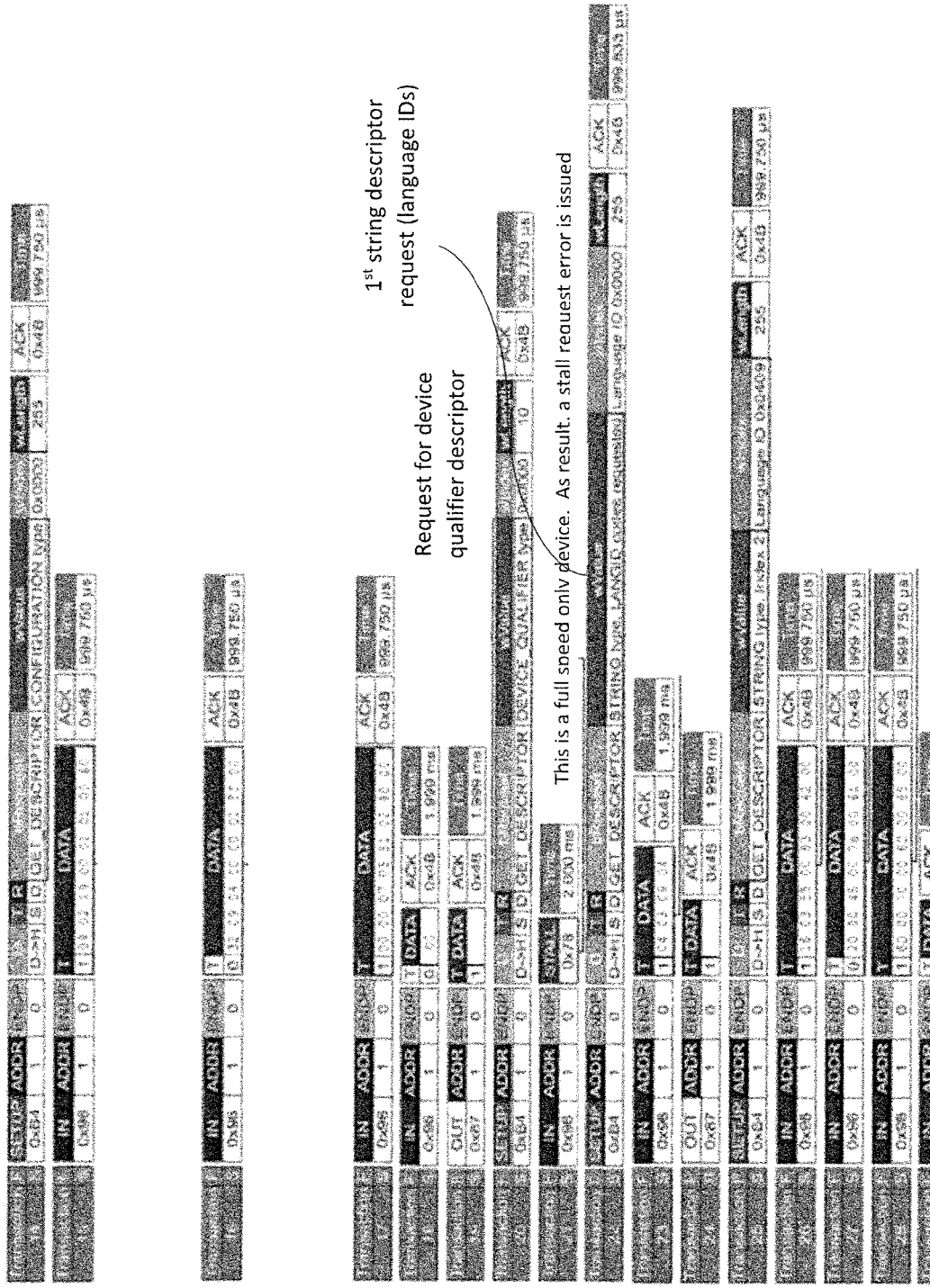

Referring to FIG. 9B and a diagram 917 therein, the following steps provide an example illustration of an optimized smart card authentication sequence. A similar sequence exists for other smart card scenarios, such as digitally signing documents, e-mails, etc. in a VDA session. The execution of this sequence illustrates another example of the use of the previously discussed method of "Map ID" pointing to observed, cached and shared client and server protocol sequences. In particular, a Map ID is used to identify and look up previously communicated smart card initialization and certificate data. Light-weight differential data is also exchanged for purposes of efficient contextualization and precise look up.

Optimized Smart Card Authentication Sequence

The client enumerates readers and their state (smart card empty, present, etc.).

A user inserts their card into the reader, the reader state changes.

The client establishes Smart Card RM Context for the server.

The client establishes smart card Communication Context for the server, based on the RM context.

Using the smart card Communication Context, the client retrieves the card ATR string, ID string and certificate. Note: The ID string uniquely identifies the card. However, some cards may hold more than one certificate, so the certificate may also be required for further contextualization. The client computes a hash of the certificate.

The client looks up the table with Map IDs based on at least one of ATR string, ID string and certificate hash.

The client sends to the server the matching Map ID and, if an exact match is not found, also differential data, e.g. at least one of: RM context; Readers and their state; smart card Context; and at least one of card ATR string, ID string, certificate hash.

The server looks up its table of Map IDs based on at least one of Map ID and differential data.

If a match is not found, the VDA Logon Process proceeds as normal.

If a match is found, the VDA Logon Process advantageously proceeds to short-circuit all of the following operations by servicing them from the server's table with cached protocol exchanges and the received contextual differential data, rather than using transactions requiring round-trips to the client: establish Smart Card RM Context; using the RM context, enumerate readers and their state; using the RM context, if there is a card present in at least one reader, establish smart card Communication Context; using the smart card Communication Context, retrieve the card ATR string; request the card ID string (for consistency with the learning phase); look up and load the CSP, e.g. based on the card ATR string; a CSP may perform crypto operations specific to a card type. (Note: This operation does not have to go to the client anyway, even during the learning phase); and retrieve the smart card certificate.

For security reasons and due to the random nature of the challenge-response mechanism, the rest of the logon process proceeds as normal:

The VDA Logon Process parses the certificate and extracts the UPN, the public key, etc. The VDA Logon Process then prompts the user for PIN, e.g. via a Logon UI. The PIN prompt becomes visible at the client device via server-to-client graphics redirection.

The user enters their PIN at the client, which is transferred to the server and into the VDA Logon Process, e.g. Logon UI.

The VDA Logon Process initiates a challenge required to determine if the user is the true owner of the smart card. The challenge may involve creating a (random) nonce sent to the card.

The VDA Logon Process also sends the PIN to the card.

The client device communicates both the PIN and the nonce to the card. The PIN is used to unlock the use of the smart card's private key, which never leaves the card.

The card uses the private key to sign the nonce and answer the challenge by sending it to the server.

The VDA Logon Process verifies the signature of the signed nonce using the public key from certificate.

The VDA Logon Process proceeds to log the user on.

Referring now to FIGS. 10A-10D, USB-specific standard initialization data exchange at bus level is shown in diagrams 920, 925, 930, 935. More specifically, the diagrams 920, 925, 930, 935 show the standard descriptors and standard responses in a USB device initialization sequence. In other words, these figures show the initialization data exchange between local devices 235*a*-235*b*, 335*a* and client computing devices 202*a*-202*b*, 302*a*-302*b* as per the USB protocol specification. For a given local device, for example, local device 235*a*, and a given client computing device, for example, client computing device 202*a*, the initialization data exchanges are expected to remain consistent between different initialization occurrences as previously discussed in the disclosure. As illustrated, it can be appreciated that examples of the standard descriptors such as configuration, interface and endpoint will be consistently repeated during each initialization sequence. Minor variations are possible in special cases. For example, a connection port may change when a user plugs in the local device 235*a* into a different USB port of the client computing device 202*a*. In these special cases, the previously discussed technique of sending light-weight differential data along with Map IDs may be applied. If significant changes occur, or an error occurs, the previously discussed technique of reverting to sending the complete uncompressed sequences may also be applied.

Thus, as described herein, the described embodiments provide improved operation of virtual desktop infrastructure computing systems, for example by providing an approach to data transfer when either coupling or decoupling the local device 235*a*-235*b*, 335*a* to the client computing devices 202*a*-202*b*, 302*a*-302*b*. Indeed, the computing systems 201, 301 leverage the fact that data transfer, such as during local device (e.g. USB device) redirection, has packets of data which are of a predictable format and sequence during initialization, surprise removal, deinitialization (i.e. termination of the local device communications). By storing the format and sequence, mapping ID numbers could be exchanged instead of complete packet and/or packet sequences between the client computing device 202a-202b, 302a-302b and the server 206, 306. This mapping ID numbers could be used to play the packet or packet sequence at the server 206, 306 and the client computing device instead of complete sequence transfer as it happens in typical approaches.

Typical approaches to data transfer using compression/encoding focus on the relationship between the current frame and the next frame for compression/optimization. The computing system 201, 301 of the disclosure is unique as it leverages behavior patterns specific to the virtual channel under consideration.

By swapping out packets with mapping ID numbers, the computing systems 201, 301 reduce aggregate traffic, improving system performance. The prior knowledge of data playback sequences may be used to create optimized packet sequences and protocol optimizations by building a mapping database of ID numbers to protocol sequence playback at the server 206, 306 and the client computing device 202a-202b, 302a-302b. In the client computing device 202a-202b, 302a-302b and the server 206, 306, special concise messages are used to send differential data and playback the sequence of steps. Thus, this may optimize the overall data transfer requirements.

For example, the diagram 900 (FIG. 11) comprises a sequence diagram showing an example of a client computing device 202a-202b, 302a-302b sending a mapping ID number (id1) as an indicator for a server 206, 306 to play the initialization sequence in the virtual desktop instance 230a-230b, 330a-330b to initialize the local device 235a-235b, 335a and return status to client computing device. Instead of the typical back and forth for local device initialization, the client computing device 202a-202b, 302a-302b and the server 206 may regenerate the sequence using their respective mapping tables.

Other features relating to computing systems are disclosed in co-pending application: titled "COMPUTING SYSTEM WITH GATEWAY DATA TRANSFER BASED UPON DEVICE DATA FLOW CHARACTERISTICS AND RELATED METHODS," Ser. No. 16/252,809, which is incorporated herein by reference in their entirety.

Many modifications and other embodiments will come to the mind of one skilled in the art having the benefit of the teachings presented in the foregoing descriptions and the associated drawings. Therefore, it is understood that the foregoing is not to be limited to the example embodiments, and that modifications and other embodiments are intended to be included within the scope of the appended claims.

That which is claimed is:

1. A computing system comprising:
a server;
at least one client computing device in communication with said server, said server configured to provide a corresponding at least one virtual desktop instance for said at least one client computing device; and
at least one local device to be coupled to a given client computing device and to be operable in a given virtual desktop instance associated with said given client computing device, thereby generating a plurality of client initialization packets;
said server configured to generate a server mapping table comprising
a plurality of known server packets associated with said at least one local device,
a plurality of server mapping identification (ID) numbers respectively associated with said plurality of known server packets, and
a plurality of different local device types associated with the plurality of server mapping ID numbers;
said given client computing device configured to generate a client mapping table comprising
a plurality of known client packets associated with said at least one local device,
a plurality of client mapping ID numbers respectively associated with said plurality of known client packets, and
a plurality of different local device types associated with the plurality of client mapping ID numbers;
wherein said given client computing device is configured to, when said at least one local device is coupled to said given client computing device,
determine whether at least one client packet from the plurality of client initialization packets is within the client mapping table,
replace the at least one client packet with at least one client mapping ID number to define a plurality of compressed client initialization packets, and
send the plurality of compressed client initialization packets to said server,
said server configured to replace the at least one client mapping ID number with the at least one client packet in the plurality of compressed client initialization packets based upon the server mapping table.

2. The computing system of claim 1 wherein said server and said given client computing device are configured to synchronize the server mapping table and the client mapping table.

3. The computing system of claim 1 wherein said server is configured to, when said at least one local device is coupled to said given client computing device:
determine whether at least one server packet from a plurality of server initialization packets is within the server mapping table;
replace the at least one server packet with at least one server mapping ID number to define a plurality of compressed server initialization packets; and
send the plurality of compressed server initialization packets to said given client computing device.

4. The computing system of claim 3 wherein said server and said given client computing device are configured to, when said at least one local device is decoupled from said given client computing device, perform the determining, the replacing, and the sending.

5. The computing system of claim 1 wherein said at least one client computing device comprises a plurality of client computing devices; and wherein said server is configured to monitor packets exchanged between said plurality of client computing devices and respective local devices to generate the server mapping table.

6. The computing system of claim 1 wherein the plurality of known server packets and the plurality of known client packets each comprises a communication standard initialization packet.

7. The computing system of claim 1 wherein the plurality of known server packets and the plurality of known client packets each comprises at least one of a smart card initialization sequence packet, a smart card authentication packet, a smart card digital signing packet, and a smart card certificate transmission packet.

8. The computing system of claim 1 wherein when the plurality of compressed client initialization packets generates an error, said server and said given client computing device are configured to initialize the at least one local device using the plurality of client initialization packets.

9. The computing system of claim 1 further comprising a bridge device coupled between said given client computing device and said server and configured to generate a bridge mapping table comprising a plurality of known bridge packets associated with said at least one local device, and a corresponding plurality of bridge mapping ID numbers.

10. The computing system of claim 1 wherein said at least one local device comprises at least one of a universal serial bus (USB) device, a TWAIN device, and a smart card device.

11. The computing system of claim 1 wherein the determining is based upon at least one of a client name, a smart card reader name, a smart card reader state, a smart card type, a smart card Answer to Reset (ATR) string, smart card ID, and a smart card certificate hash.

12. A method for operating a given client computing device in communication with a server, the server to provide a given virtual desktop instance for the given client computing device, at least one local device to be coupled to the given client computing device and to be operable in the given virtual desktop instance associated with the given client computing device, the method comprising:
    generating a client mapping table comprising
        a plurality of known client packets associated with the at least one local device,
        a plurality of client mapping identification (ID) numbers respectively associated with the plurality of known client packets, and
        a plurality of different local device types associated with the plurality of client mapping ID numbers; and
    when the at least one local device is coupled to the given client computing device,
        generating a plurality of client initialization packets,
        determining whether at least one client packet from the plurality of client initialization packets is within the client mapping table,
        replacing the at least one client packet with at least one client mapping ID number to define a plurality of compressed client initialization packets, and
        sending the plurality of compressed client initialization packets to the server,
        the server configured to replace the at least one client mapping ID number with the at least one client packet in the plurality of compressed client initialization packets based upon a server mapping table.

13. The method of claim 12 further comprising synchronizing the server mapping table and the client mapping table.

14. The method of claim 12 further comprising when the at least one local device is decoupled from the given client computing device, performing the determining, the replacing, and the sending.

15. The method of claim 12 wherein the plurality of known client packets each comprises a communication standard initialization packet.

16. The method of claim 12 wherein the plurality of known client packets each comprises at least one of a smart card initialization sequence packet, a smart card authentication packet, a smart card digital signing packet, and a smart card certificate transmission packet.

17. A method for operating a server in communication with at least one client computing device to provide a corresponding at least one virtual desktop instance for the at least one client computing device, at least one local device to be coupled to a given client computing device and to be operable in a given virtual desktop instance associated with the given client computing device, thereby generating a plurality of server initialization packets, the method comprising:
    generating a server mapping table comprising
        a plurality of known server packets associated with the at least one local device,
        a plurality of server mapping identification (ID) numbers respectively associated with the plurality of known server packets, and
        a plurality of different local device types associated with the plurality of server mapping ID numbers; and
    when the at least one local device is coupled to the given client computing device,
        determining whether at least one server packet from the plurality of server initialization packets is within the server mapping table,
        replacing the at least one server packet with at least one server mapping ID number to define a plurality of compressed server initialization packets, and
        sending the plurality of compressed server initialization packets to the given client computing device,
        said given client computing device configured to replace the at least one server mapping ID number with the at least one server packet in the plurality of compressed server initialization packets based upon a client mapping table.

18. The method of claim 17 further comprising synchronizing the server mapping table and the client mapping table.

19. The method of claim 17 further comprising when the at least one local device is decoupled from the given client computing device, performing the determining, the replacing, and the sending.

20. The method of claim 17 further comprising monitoring packets exchanged between a plurality of client computing devices and respective local devices to generate the server mapping table.

21. The method of claim 17 wherein the plurality of known server packets each comprises a communication standard initialization packet.

22. The method of claim 17 wherein the plurality of known server packets each comprises at least one of a smart card initialization sequence packet, a smart card authentication packet, a smart card digital signing packet, and a smart card certificate transmission packet.

23. The method of claim 12 further comprising when the plurality of compressed client initialization packets generates an error, initializing the at least one local device using the plurality of client initialization packets.

24. The method of claim 17 further comprising when the plurality of compressed server initialization packets generates an error, initializing the at least one local device using the plurality of server initialization packets.

* * * * *